United States Patent [19]
Reed et al.

[11] Patent Number: 5,862,161
[45] Date of Patent: Jan. 19, 1999

[54] SAMPLED AMPLITUDE READ CHANNEL WITH SIMPLIFIED SEQUENCE DETECTOR MATCHED TO PARTIAL ERASURE

[75] Inventors: David E. Reed, Westminster; Richard T. Behrens, Louisville, both of Colo.

[73] Assignee: Cirrus Logic, Inc., Fremont, Calif.

[21] Appl. No.: 697,694

[22] Filed: Aug. 28, 1996

[51] Int. Cl.$^6$ .......................... G06F 11/00; H03M 13/00
[52] U.S. Cl. .......................................................... 371/55
[58] Field of Search .............................. 371/55, 48, 43.8; 360/51

[56] References Cited

U.S. PATENT DOCUMENTS

| | | | |
|---|---|---|---|
| 4,910,417 | 3/1990 | El Gamal et al. | 307/465 |
| 5,136,593 | 8/1992 | Moon et al. | 371/43 |
| 5,317,711 | 5/1994 | Bourekas et al. | 395/425 |
| 5,418,452 | 5/1995 | Pyle | 324/158.1 |
| 5,473,754 | 12/1995 | Folwell et al. | 395/183.21 |
| 5,488,688 | 1/1996 | Gonzales et al. | 395/183.1 |
| 5,668,678 | 9/1997 | Reed et al. | 360/51 |

OTHER PUBLICATIONS

J Fitzpatrick and J K Wolf, "A Maximum Likelihood Detector or Nonlinear Magnetic Recording" *IEEE Transactions on Magnetics*, vol. 27 No. 6, Nov. 1991.

R. Cideciyan, F Dolivo, R Hermann, W Hirt, and W Schott, "A PRML System for Digital Magnetic Recording", *IEEE Journal on Selected Areas in Communications*, vol. 10, No. 1 Jan. 1992.

G. David Forney, Jr. "The Viterbi Algorithm", *Proceedings of the IEEE*, vol. 61, No. 3, Mar. 1973.

Razmik Karabed and Paul Siegel, "Coding For Higher Order Partial Response Channels", *SPIE*, vol. 2605, pp. 115–126.

Inku Lee, Takashi Yamauchi, and John Cioffi, "Modified Maximum Likelihood Sequence Estimation in a Simple Partial Erasure Model", *New Orleans Supercomm/Icc*, May 1–5, 1994, pp.245–249.

J. Moon and B. Brickner, "Maximum Transition Run Codes For Data Storage Systems", *IEEE Inter Mag.*, Seattle, WA., April 1996.

William Bliss and David Reed, "Analysis of HDD Thin–film–head Read Channel Performance as a Function of Media Thickness and RLL Code d Constraint", *SPIE*, vol. 2605, pp 264–275.

*Primary Examiner*—Phung M. Chung
*Attorney, Agent, or Firm*—Howard H. Sheerin; Dan A. Shifrin

[57] ABSTRACT

This invention provides apparatus for reliably and efficiently reading data from a magnetic storage medium under the condition that adjacent magnetization regions are partially erased. A simplified nonlinear description of a read signal resulting from such partially erased magnetization regions is used to derive a state machine model of the read signal. The state machine model implicitly defines a sequence detector for demodulating recorded data from received samples. For a PR4 signal, the state machine has ten states; for an EPR4 signal, the state machine has eighteen states; and for an EEPR4 signal, the state machine has twenty-six states. The PR4 machine is further simplified using squaring and state sharing to provide state machine models with six and four states.

16 Claims, 17 Drawing Sheets

SAMPLED AMPLITUDE READ CHANNEL WITH SIMPLIFIED SEQUENCE DETECTOR MATCHED TO PARTIAL ERASURE

FIELD OF INVENTION

The present invention relates to magnetic storage systems for digital computers and, more particularly, to a read channel that employs a reduced-complexity detector matched to a signal model that includes partial erasure.

CROSS REFERENCE TO RELATED APPLICATIONS AND PATENTS

This application is related to the following co-pending U.S. patent application Ser. No. 08/313,491 entitled "Improved Timing Recovery for Synchronous Partial Response Recording."

This application is also related to the following U.S. Pat. No. 5,291,499 entitled "Method and Apparatus for Reduced-Complexity Viterbi-Type Sequence Detectors."

The above-named patent application and patent are assigned to the same entity, and are incorporated herein by reference.

BACKGROUND OF THE INVENTION

In magnetic storage systems for computers, a digital data sequence serves to modulate current in a read/write head coil in order to write a corresponding sequence of magnetic flux transitions onto the surface of a magnetic medium in concentric, radially spaced tracks at a predetermined baud rate. To read this recorded data, the read/write head again passes over the magnetic medium and transduces the magnetic transitions into pulses of alternating polarity in a continuous time analog read signal. These pulses are decoded by read channel circuitry to reproduce the digital data sequence.

Decoding the pulses into the digital data sequence can be performed by a peak detector in a conventional analog read channel. In such conventional peak detectors, analog circuitry, responsive to threshold crossing or derivative information, detects peaks in the continuous time analog read signal generated by the read head. The continuous time analog read signal is segmented into bit cell periods and interpreted during these bit cell periods. The presence of a peak during the bit cell period is detected as a "1" bit, whereas the absence of a peak is detected as a "0" bit.

As magnetic flux transitions are packed closer together on the magnetic medium in an effort to increase data density, adjacent pulses begin to overlap with one another, resulting in a type of distortion, known as intersymbol interference (ISI), in the read signal. Intersymbol interference can cause a peak to shift out of its bit cell, or to decrease in magnitude. This can lead to detection errors.

The most common detection errors occur when the bit cells are not correctly aligned with the pulses in the continuous time analog read signal. Timing recovery, then, adjusts the bit cell periods so that peaks of the continuous time analog read signal occur in the center of the bit cells on average in order to minimize detection errors. Since timing information is derived only when peaks are detected, the input digital data sequence is normally run length limited (RLL) to place an upper limit on the number of consecutive "0" bits.

The ISI effect can be reduced by decreasing the data density or by employing a coding scheme that places a lower limit on the number of "0" bits that occur between "1" bits.

Thus, a compromise must be reached between the requirement to reduce ISI (which calls for a large number of consecutive "0" bits), and the need for timing recovery (which calls for a small number of consecutive "0" bits). A (d,k) run-length limited (RLL) code constrains the minimum number of "0" bits between "1" bits to d, and the maximum number of consecutive "0" bits to k.

Discrete time sequence detectors in sampled amplitude read channels can compensate for limited amounts of intersymbol interference and are less susceptible to channel noise than analog peak detectors. As a result, discrete time sequence detectors increase the capacity and reliability of the magnetic storage system, and they are therefore preferred over simple analog peak detectors.

There are several well known discrete time sequence detection methods including discrete time pulse detection (DPD), partial response (PR) with Viterbi detection, maximum likelihood sequence detection (MLSD), decision-feedback equalization (DFE), enhanced decision-feedback equalization (EDFE), and fixed-delay tree-search with decision-feedback (FDTS/DF).

Sampled amplitude detection, such as partial response with Viterbi detection, allows for increased data density by compensating for intersymbol interference and the effect of channel noise. Unlike conventional peak detection systems that detect the presence or absence of a peak, sampled amplitude recording detects digital data by interpreting, at discrete time instances, the actual value of the pulse data.

To this end, the read channel comprises a sampling device for sampling the analog read signal, a timing recovery circuit for synchronizing the samples to the baud rate (code bit rate), a low-pass analog filter to process the read signal before it is sampled so as to reduce the effects of aliasing, a digital equalizing filter to equalize the sample values according to a desired partial response after the signal has been sampled, and a discrete time sequence detector, such as a Viterbi detector, to interpret the equalized sample values in context to determine a most likely sequence for the digital data sequence (i.e., using maximum likelihood sequence detection). In this manner, a sampled amplitude read channel can take into account the effect of ISI and channel noise during the detection process, thereby decreasing the probability of a detection error. This increases the effective signal to noise ratio and, for a given (d,k) constraint, allows for significantly higher data density as compared to conventional analog peak detection read channels.

The application of sampled amplitude techniques to digital communication channels is well documented. See, for example:

Y. Kabal and S. Pasupathy, "Partial Response Signaling," *IEEE Trans. Commun. Tech.,* Vol. COM-23, pp. 921–934, Sep. 1975;

E. A. Lee and D. G. Messerschmitt, "Digital Communication," Kluwer Academic Publishers, Boston, 1990; and G. D. Forney, Jr., "The Viterbi Algorithm," *Proc. IEEE,* Vol. 61, pp. 268–278, Mar. 1973.

Applying sampled amplitude techniques to magnetic storage systems is also well documented. See, for example:

Cideciyan et al, "A PRML System for Digital Magnetic Recording," *IEEE Journal on Selected Areas in Communications,* Vol. 10, No. 1, pp. 38–56, Jan. 1992;

Wood et al, "Viterbi Detection of Class IV Partial Response on a Magnetic Recording Channel," *IEEE Trans. Commun.,* Vol. COM-34, No. 5, pp. 454–461, May 1986;

Coker et al, "Implementation of PRML in a Rigid Disk Drive," *IEEE Trans. on Magnetics,* Vol. 27, No. 6, Nov. 1991;

Carley et al, "Adaptive Continuous-Time Equalization Followed by FDTS/DF Sequence Detection," *Digest of the Magnetic Recording Conference*, Aug. 15–17, 1994, p. C3;

Moon et al, "Constrained Complexity Equalizer Design for Fixed Delay Tree Search with Decision Feedback," *IEEE Trans. on Magnetics*, Vol. 30, No. 5, Sep. 1994;

Abbott et al, "Timing Recovery for Adaptive Decision Feedback Equalization of the Magnetic Storage Channel," *Globecom '90, IEEE Global Telecommunication Conference*, 1990, San Diego, Calif., Nov. 1990, pp. 1794–1799;

Abbott et al, "Performance of Digital Magnetic Recording with Equalization and Offtrack Interference," *IEEE Trans. on Magnetics*, Vol. 27, No. 1, Jan. 1991;

Cioffi et al, "Adaptive Equalization in Magnetic-Disk Storage Channels," *IEEE Communication Magazine*, Feb. 1990; and R. Wood, "Enhanced Decision Feedback Equalization," *Intermag '90*.

Several forms of distortion in addition to intersymbol interference are present in the analog read signal. One such form of distortion that is particularly troublesome at high data densities is caused by partial erasure of magnetically-stored information. This occurs because each bit of information may, for example, be stored as an individual region in which most magnetic domains are oriented in the same direction. However, the transition from one orientation to another is not abrupt but takes place over a finite distance, and so, at high transition densities, adjacent regions of magnetization interact to reduce the strength of magnetization of individual regions. For example, if the magnetization in a particular region has a predominantly north-south orientation and both of its neighboring regions have similar orientations, then the strength of its magnetization will be substantially unaltered by its neighbors. However, if it has one neighbor with an opposite (i.e., south-north) orientation, the border with this neighbor will be ill-defined and the net magnetization of the region will be reduced. This reduction in magnetization is exacerbated if both of the region's neighbors have magnetic orientations opposite to its own.

The reduction of the strength of magnetization of regions with differently oriented neighbors, referred to as partial erasure, reduces the amplitude of corresponding pulses in the read signal. Thus decoders that do not account for partial erasure are not optimal.

One prior art solution to this problem is described in "Modified Maximum Likelihood Sequence Estimation in a Simple Partial Erasure Model," by I. Lee, T. Yamauchi, and J. M. Cioffi, *IEEE International Conference on Communications*, May 1–5, 1994, New Orleans. This paper describes how a sequence detector can be matched to a read signal that includes partial erasure. However, it also explains that conventional channel models for describing partial erasure may result in detectors with prohibitive complexity. The paper presents a simplified partial erasure model in which the amplitude of a pulse is reduced by a factor $\gamma<1$ if the magnetic transition that caused it has one neighboring transition, and is reduced by a factor $\gamma^2$ if the transition that caused it has two neighboring transitions. The authors derive a state machine model for a reduced complexity sequence detector matched to partial erasure in a PR4 d=0 read channel. The state machine has been reduced to eleven states. However, such an eleven state machine is still not the optimal implementation.

It is a general aspect of the present invention to implement a PR4 d=0 read channel comprising a sequence detector which operates according to a state machine matched to partial erasure and having less than eleven states.

It is a further aspect of the invention to implement a read channel comprising a sequence detector which operates according to a state machine matched to partial erasure and a coding scheme which increases a minimum distance error event of the sequence detector.

It is a further aspect of the present invention to provide an EPR4 d=1 read channel signal comprising a sequence detector that matched to partial erasure.

It is a further aspect of the present invention to provide an EEPR4 d=1 read channel signal comprising a sequence detector that matched to partial erasure.

SUMMARY OF THE INVENTION

One aspect of the present invention is presented in a read channel for a PR4 d=0 signal with a sequence detector that compensates for partial erasure, wherein the state machine representation of the sequence detector has ten states.

Utilizing state squaring and state sharing methods, the number of states in the PR4 d=0 sequence detector is further reduced in two alternative embodiments having six and four states each.

A further aspect of the invention is presented in a read channel comprising a sequence detector which operates according to a state machine matched to partial erasure and a coding scheme which increases a minimum distance error event of the sequence detector.

Similar read channels and sequence detectors that compensate for partial erasure are presented for EPR4 and EEPR4 signals having a code constraint of d=1.

BRIEF DESCRIPTION OF THE DRAWINGS

The above and other aspects and advantages of the present invention will be better understood by reading the following detailed description in conjunction with the drawings in which.

Figure 7A:
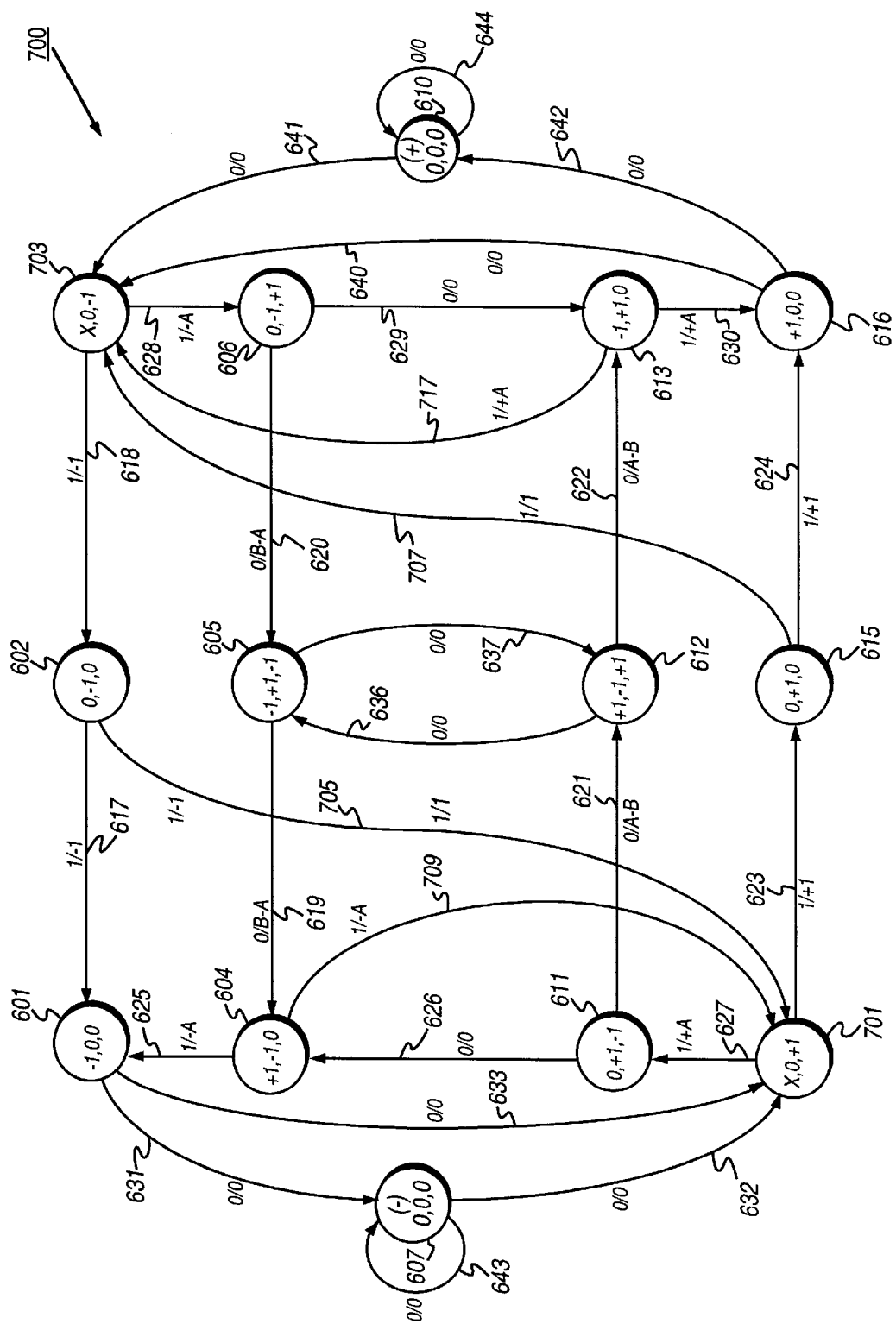
FIGS. 7A, 7B, and 7C show state machines with successively fewer states generated from the state machine of FIG.
Figure 7B:
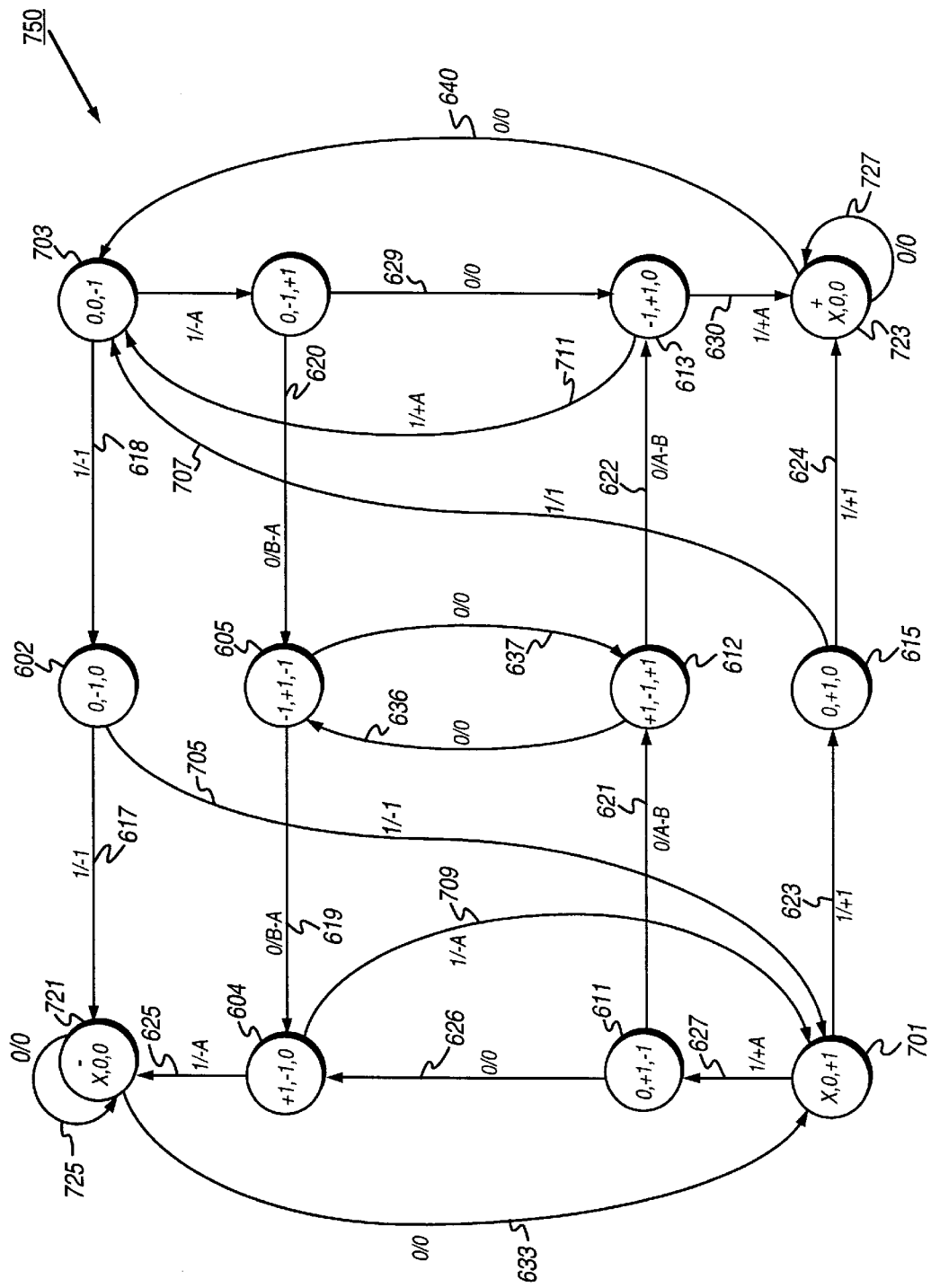
Figure 7C:
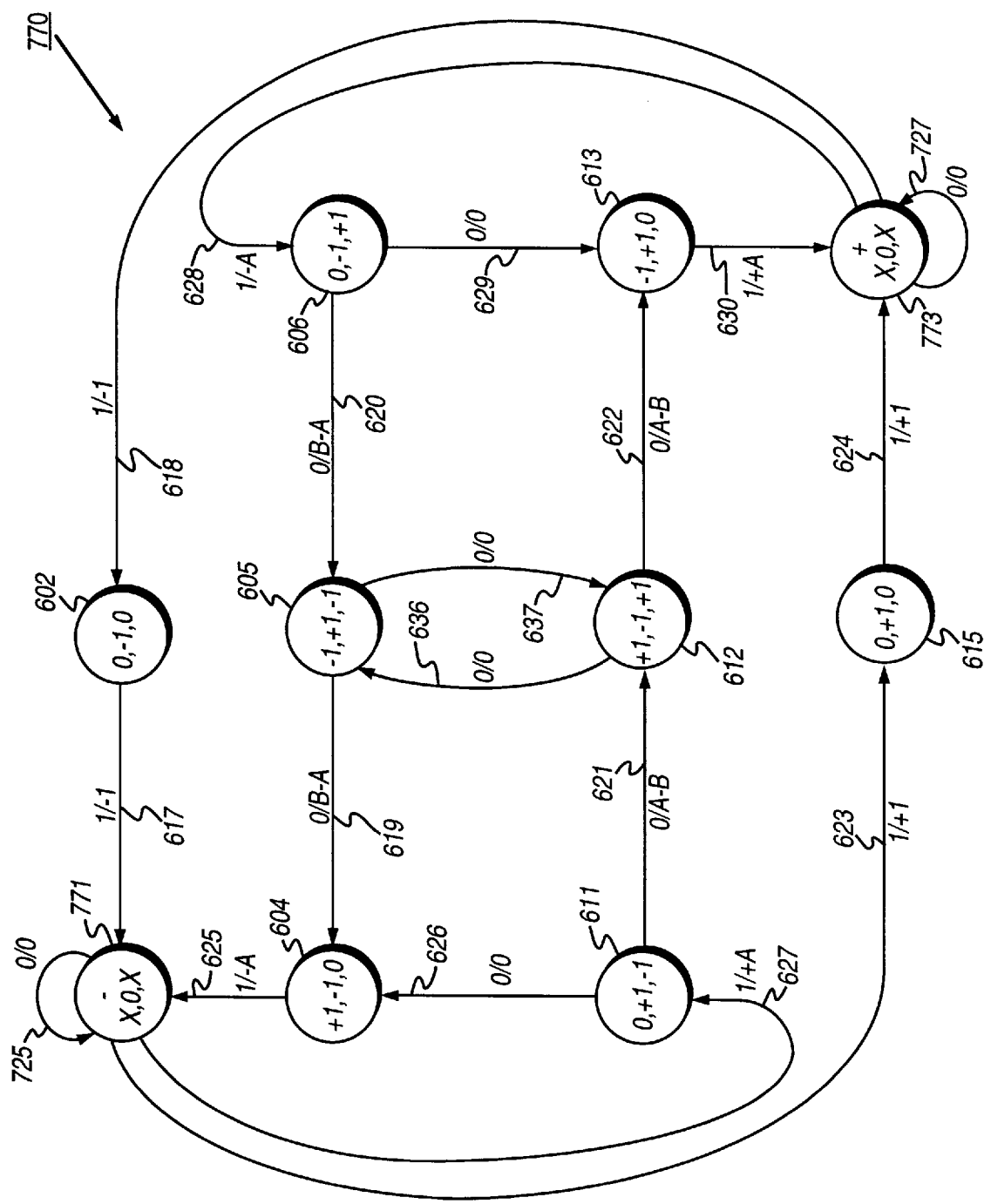
Figure 7D:
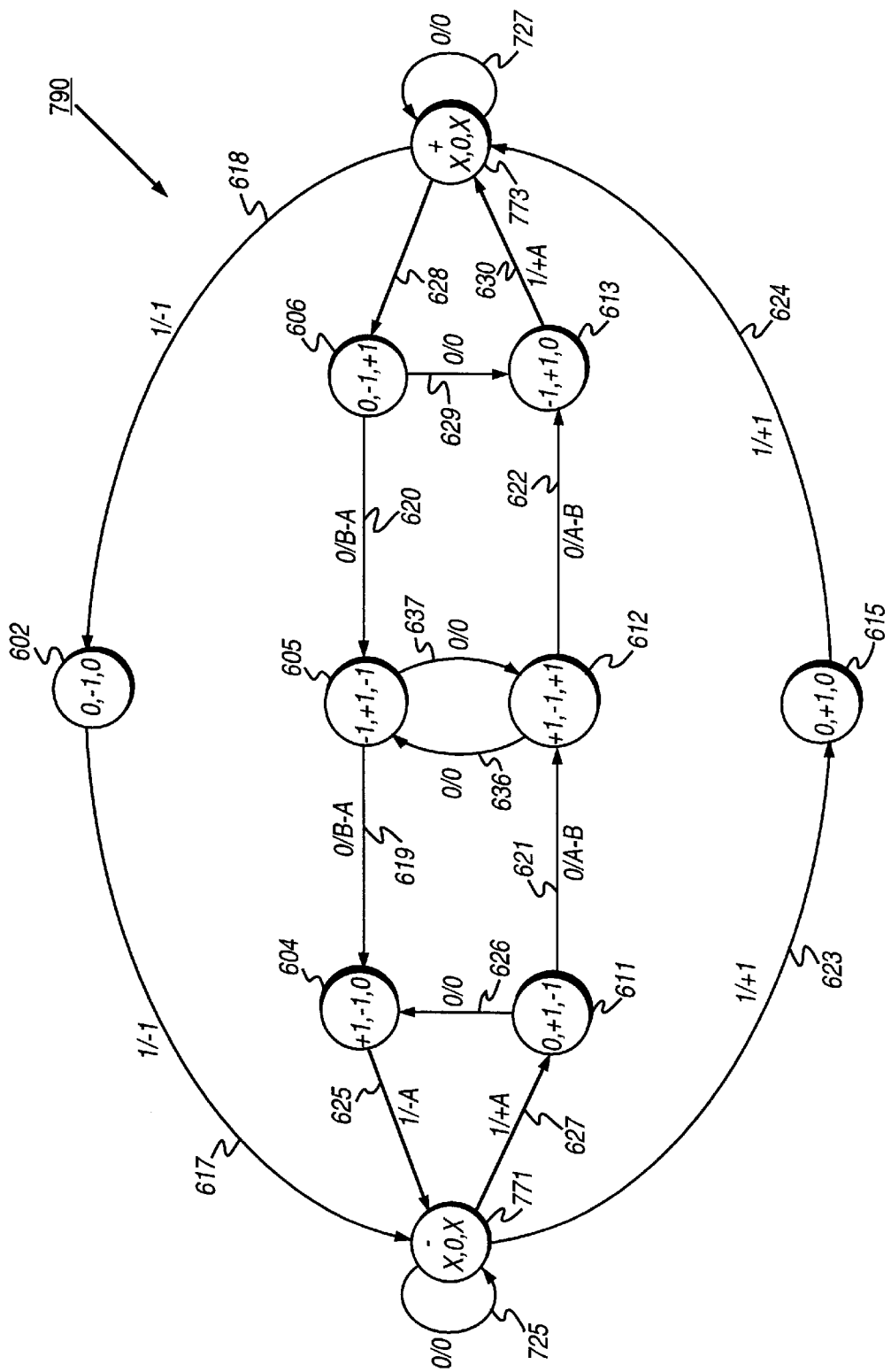
Figure 8:
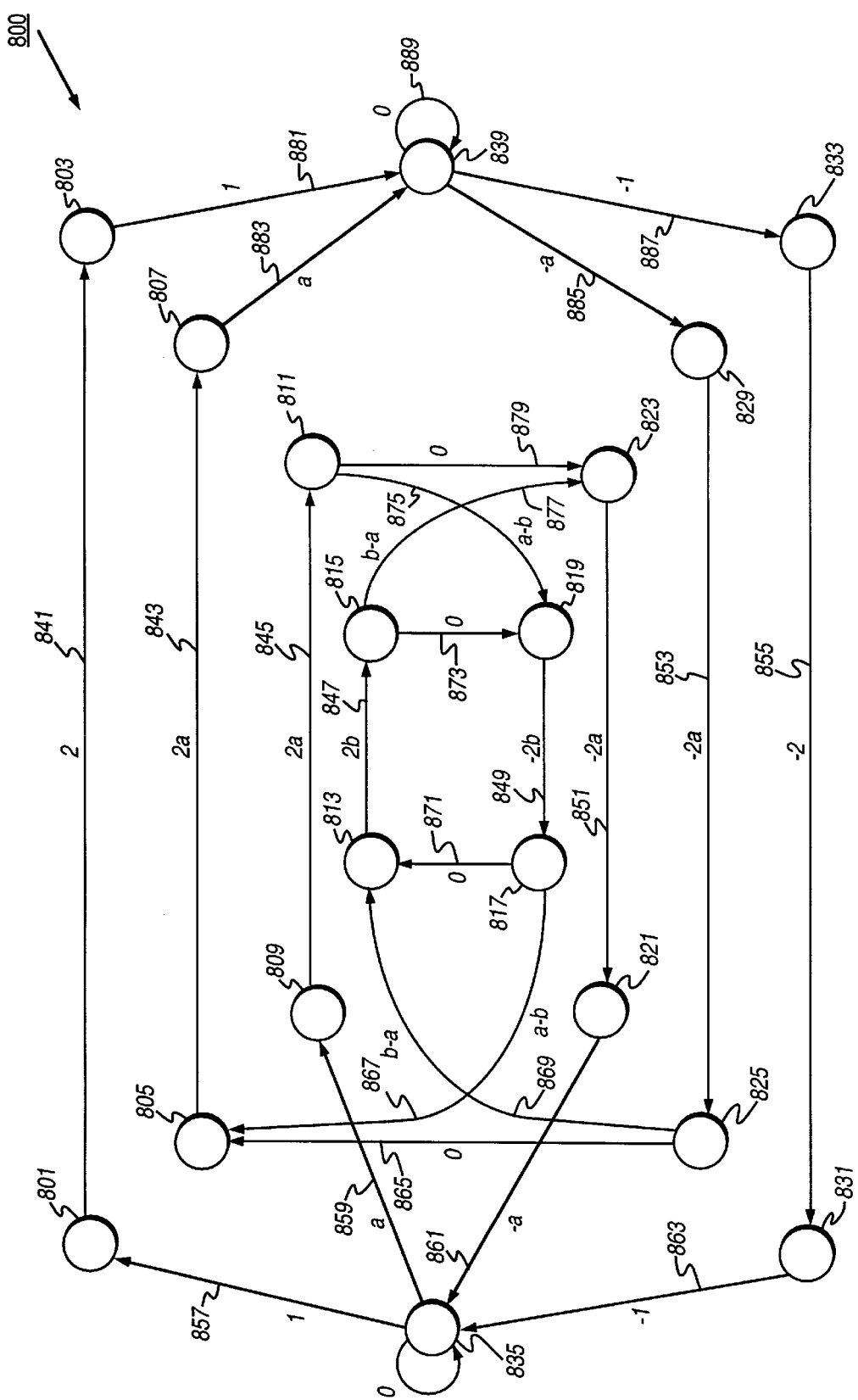
Figure 9:
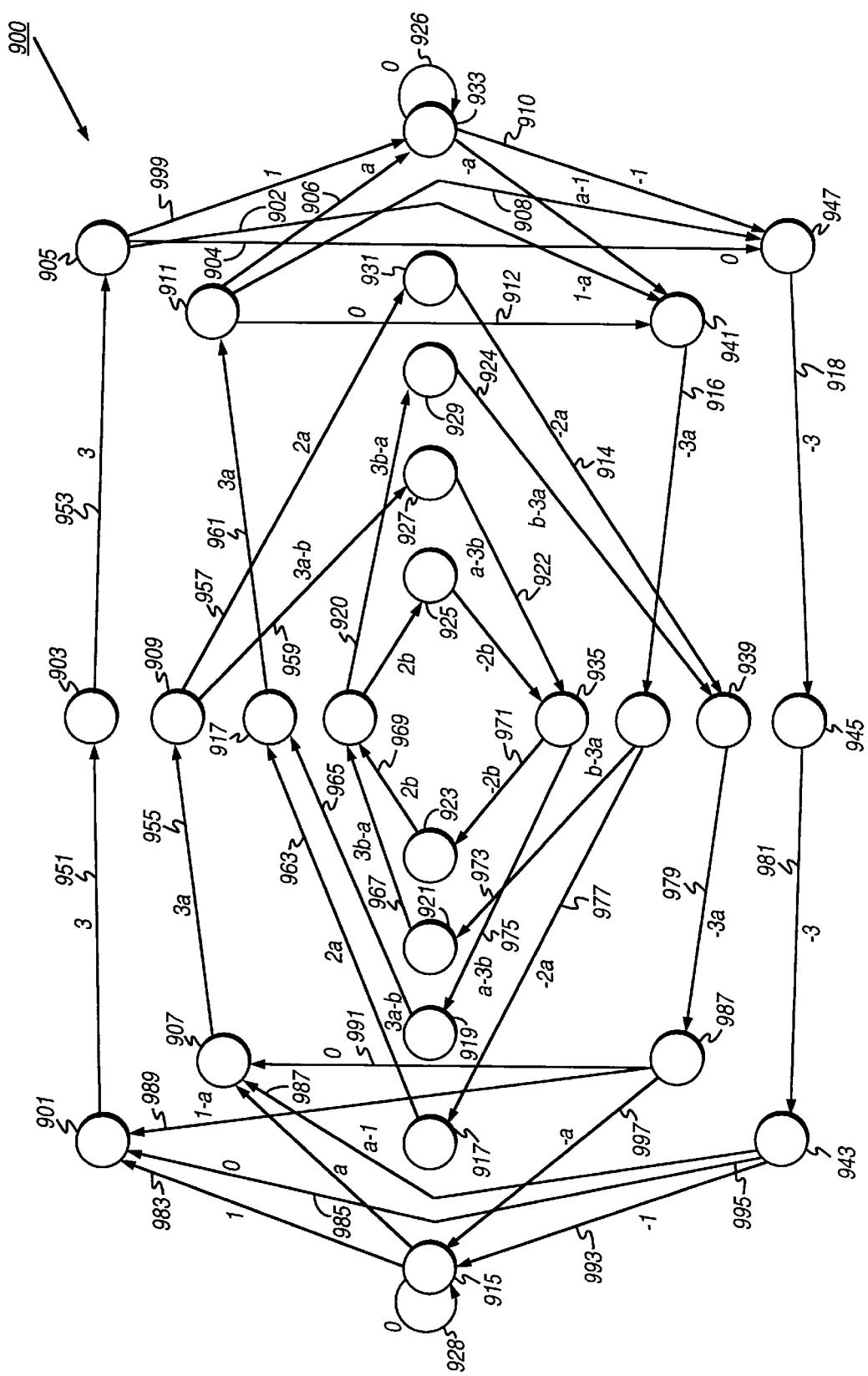
Figure 10:
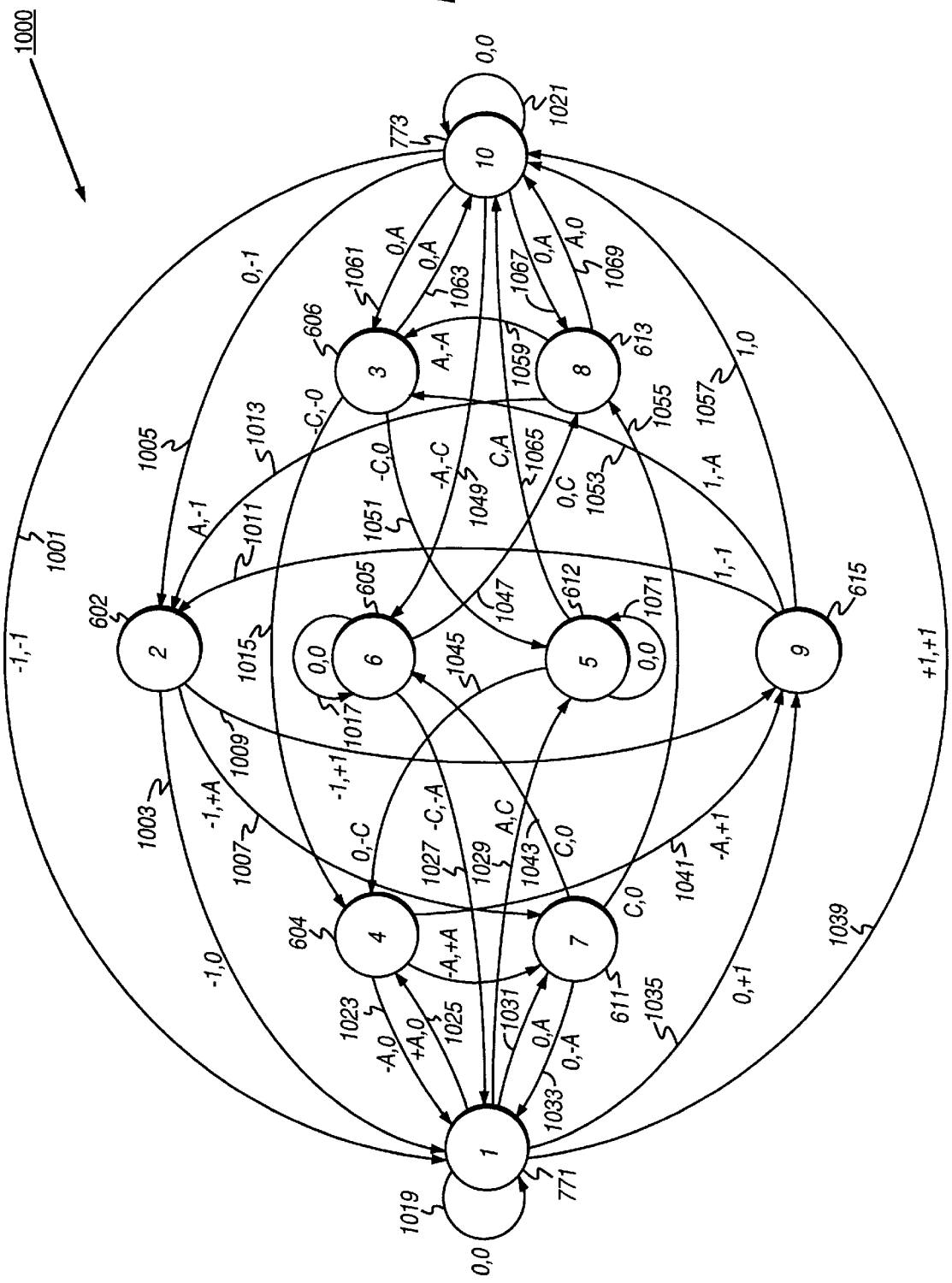
Figure 11:
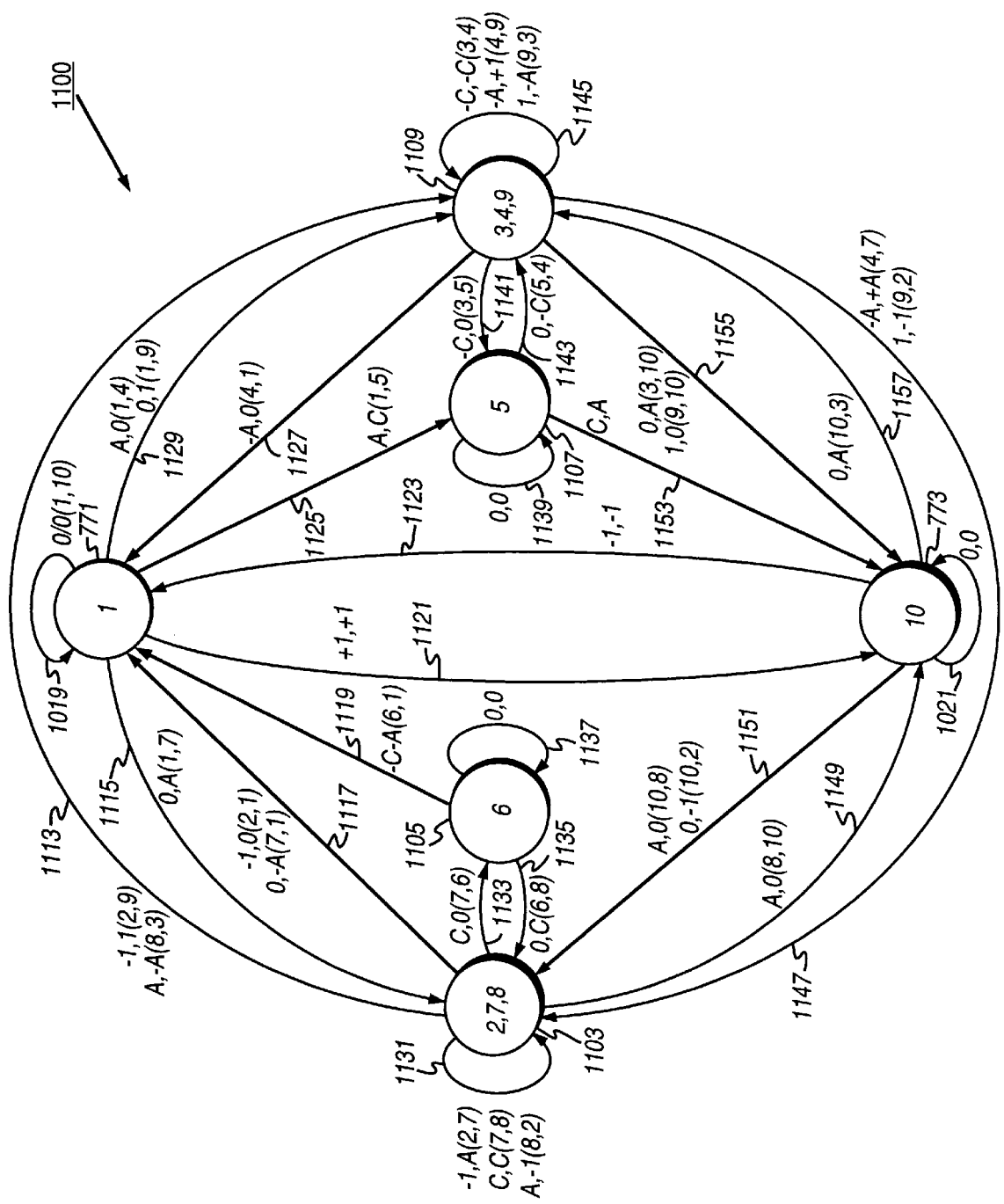
Figure 12:
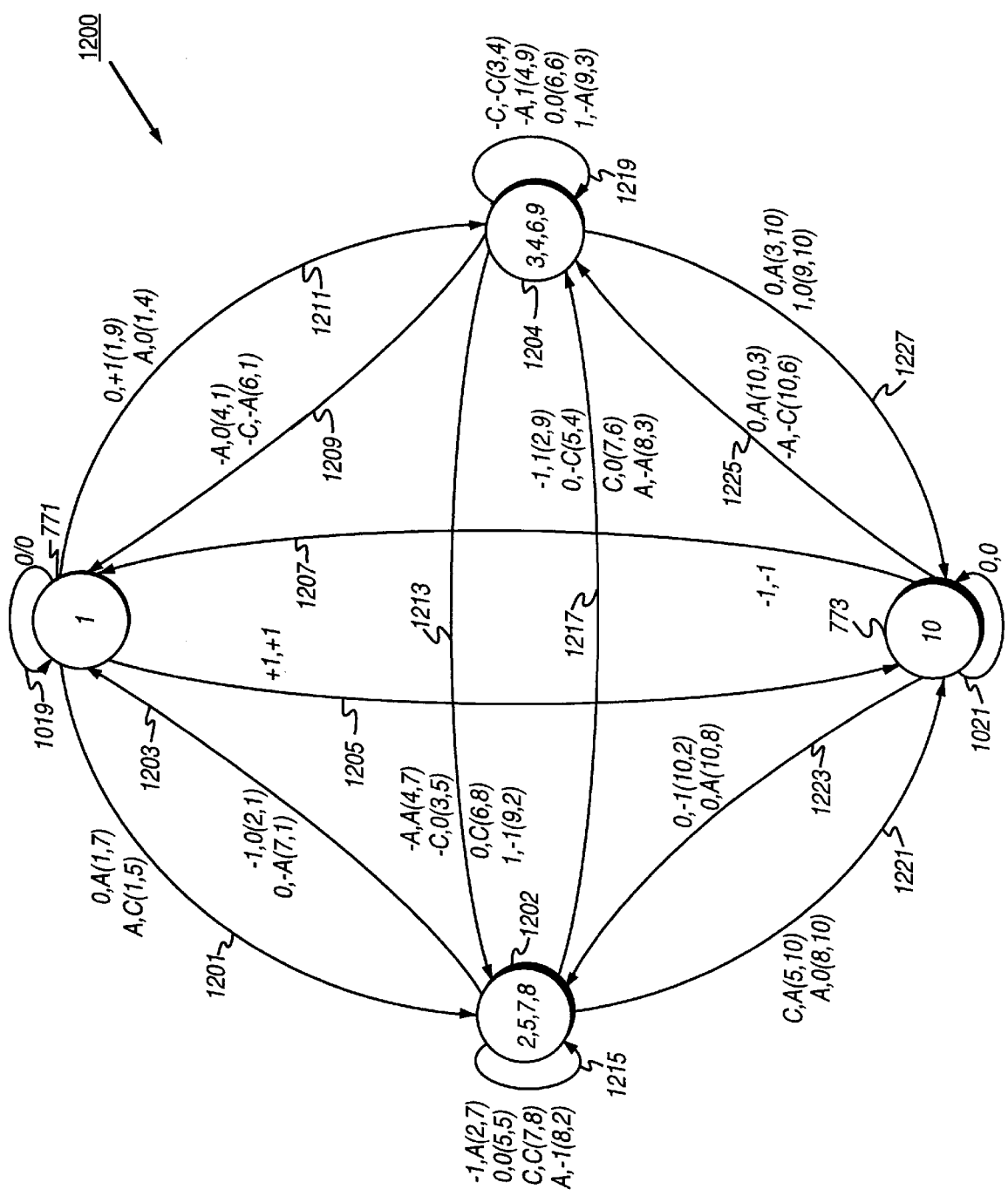

6, with each machine being derived from a predecessor by merging equivalent states;

FIG. 7D shows a state machine equivalent to the state machine of FIG. 7C, but redrawn for clarity;

FIG. 8 shows a state machine representation of a signal model, or equivalently for a sequence detector, for an EPR4 d=1 signal including the effects of partial erasure;

FIG. 9 shows a state machine representation of a signal model, or equivalently for a sequence detector, for an EEPR4 d=1 signal including the effects of partial erasure;

FIG. 10 shows a state machine obtained from the state machine of FIG. 7D by the process of squaring the machine;

FIG. 11 shows a state machine representation of a signal model, or equivalently for a sequence detector, for a PR4 d=0 signal including the effects of partial erasure, the machine having six states and being derived from the state machine of FIG. 10 using state sharing; and FIG. 12 shows a state machine representation of a signal model, or equivalently for a sequence detector, for a PR4 d=0 signal including the effects of partial erasure, the machine having four states and being derived from the state machine of FIG. 10 using state sharing.

DETAILED DESCRIPTION OF THE PREFERRED EMBODIMENT

Data Format

Figure 2A:
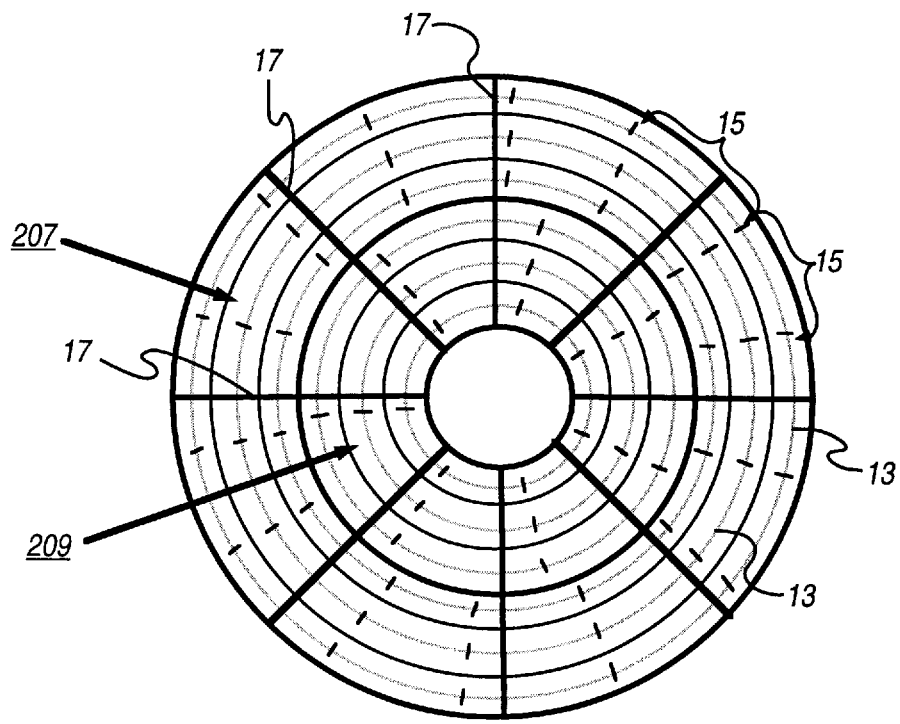
FIG. 2A shows an exemplary data format of a magnetic disk having a plurality of concentric tracks, each track comprising a plurality of user data sectors and embedded servo wedges.

FIG. 2A shows an exemplary data format of a magnetic medium comprising a plurality of concentric data tracks 13 wherein each data track comprises a plurality of sectors 15, and wherein a plurality of servo fields 17 are embedded in the sectors. A disk controller processes servo fields 17 to verify the track and sector position of the read/write head. Additionally, the disk controller processes servo bursts within servo field 17 to keep the head aligned over desired track 13 while writing and reading data.

Figure 2B:
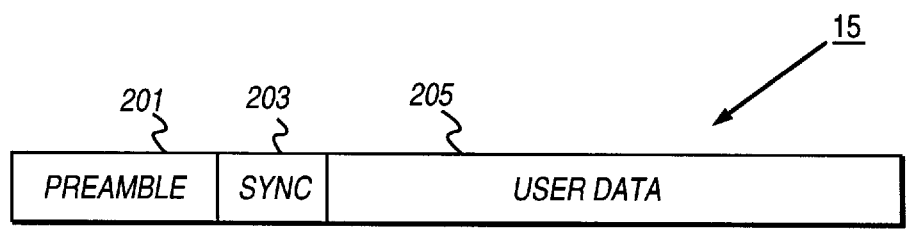
FIG. 2B shows an exemplary format of a user data sector.

FIG. 2B shows the format of sector 15, comprising acquisition preamble 201, synchronization mark 203, and user data 205. Timing recovery 28 processes acquisition preamble 201 to acquire the correct sampling frequency and phase before reading user data 205, and synchronization mark 203 demarcates the beginning of user data 205.

To increase the overall storage density, the disk is partitioned into an outer zone 207 comprising fourteen data sectors per track, and an inner zone 209 comprising seven data sectors per track. In practice, the disk is actually partitioned into several zones and the data recorded and detected at varying data rates.

Sampled Amplitude Recording Channel

In general, a very simple magnetic recording system for digital data results when the data is contained in a retrieved waveform, the waveform is sampled at regular intervals, and the data is arranged such that each sample contains information from only one data bit. In this case, a simple detector suffices to extract the data from the waveform. In practical high-density recording systems, however, each sample of the waveform contains information from adjacent overlapping samples.

Although sequence detectors can be built to extract the data from waveforms with multiple overlapping pulses, such sequence detectors require many states in their signal model. Equalization filters are therefore usually included to adjust the pulse response of the magnetic system such that each pulse contains information from a very small number of bits. However, in addition to reducing the pulse width, equalization filters may distort any noise that is present in the waveform.

Most sequence detectors are only optimal in the presence of noise samples that are statistically independent and have a Gaussian probability distribution. After being distorted by filtering to reduce the pulse width, the noise no longer fits this description, and the sequence detector is no longer optimal. The most obvious solution to this problem is to include a whitening filter and to redesign the sequence detector to match the signal model in the presence of equalization and whitening. This obvious solution, however, can result in some unnecessarily complicated circuitry. Instead of using this obvious but complicated solution, system designers usually choose a compromise between depth of filtering and complexity of the sequence detector.

One common compromise is to use an equalization filter that causes the overall magnetic recording channel to have a transfer function of the partial-response IV (PR4) type. Other popular types include EPR4 and EEPR4. These responses provide a desirable compromise between filter simplicity and resulting pulse width. In all three of these implementations, the pulse shape after filtering exhibits nulls at all but a few chosen sampling points. Table 1 gives the dipulse response of the three transfer functions. For example, Table 1 shows that the dipulse response of a PR4 system ideally produces a read sequence comprising a sample with unit amplitude, followed by a sample with zero amplitude, followed by a sample with unit amplitude and negative polarity.

Figure 1:
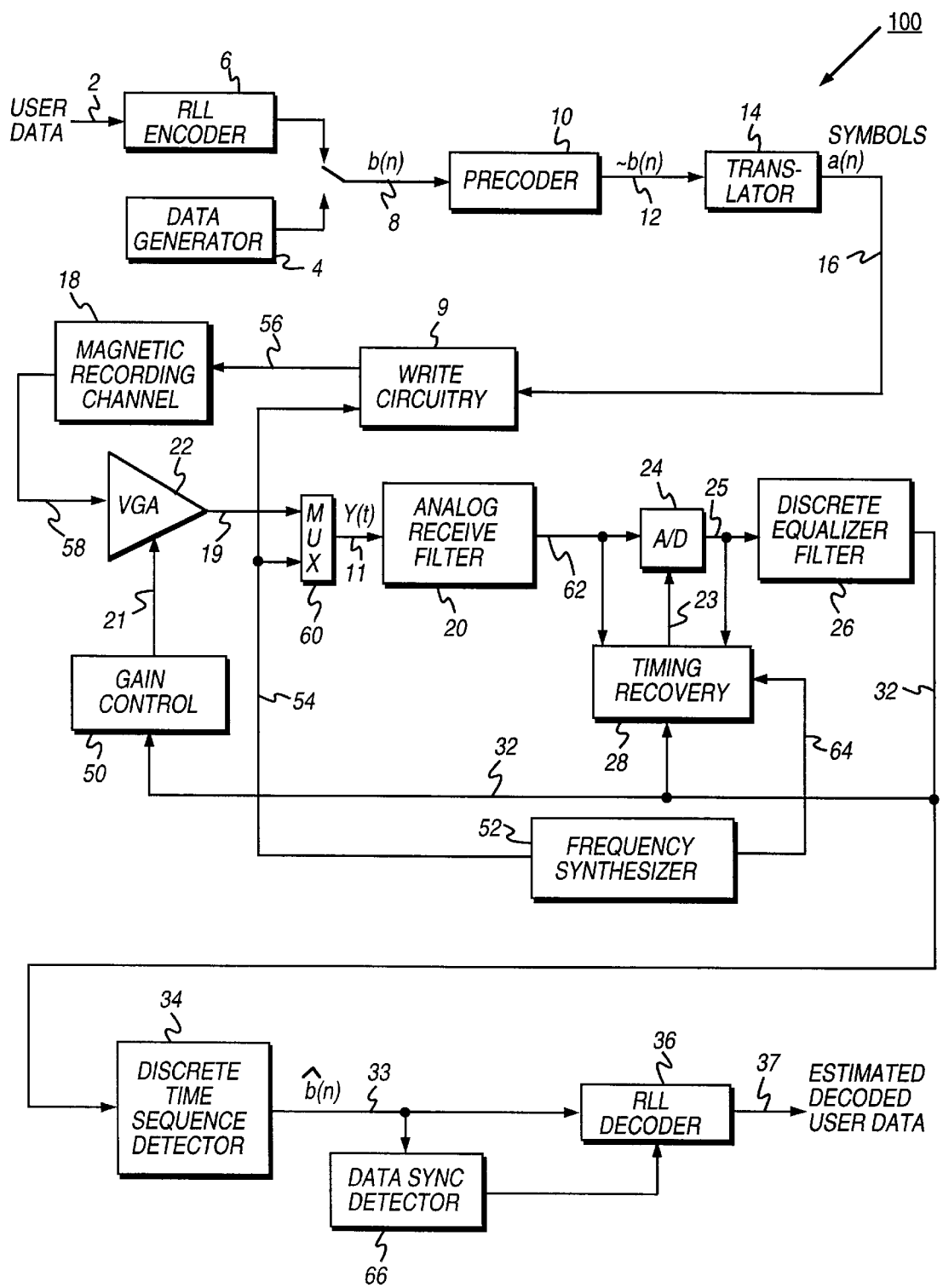
FIG. 1 is a block diagram of a conventional sampled amplitude read channel.

FIG. 1 shows a block diagram of conventional sampled amplitude read/write recording channel 100 using partial response signaling and sequence detection. During a write operation, either user data 2 or preamble data from data generator 4 is written onto the medium. RLL encoder 6 encodes user data 2 into binary sequence b(n) 8 according to a (d,k) RLL constraint. Precoder 10 precodes binary sequence 8 to compensate for the transfer function of recording channel 18 and equalizing filters to form precoded sequence ~b(n) 12. Translator 14 translates precoded sequence ~b(n) 12 into symbols a(n) 16 according to the following rules: if ~b(N)=0 then a(N)=−1, and if ~b(N)=1 then a(N)=+1. Symbols 16 modulate the current in a recording head coil at a baud rate 1/T to record the binary sequence onto the magnetic medium.

When reading the binary sequence back, variable gain amplifier 22 adjusts the amplitude of the analog read signal on line 58, and analog filter 20 provides initial equalization of the analog read signal Y(t) 11 toward a desired response. Sampling device 24 samples the output of analog filter 20, and discrete time filter 26 provides further equalization towards the desired response.

Equalized sample values from discrete time filter 26 are applied over line 32 to gain control circuit 50 and timing control circuit 28 for adjusting the amplitude of the read signal and the frequency and phase of sampling device 24, respectively. Timing recovery adjusts the frequency of sampling device 24 over line 23 in order to synchronize equalized samples on line 32 to the waveform so that the effect of intersymbol interference is minimized. Gain control circuit 50 adjusts the gain of variable gain amplifier 22 over line 21. Equalized samples Y(n) on line 32 are sent to discrete time sequence detector 34 (which may, for example, be a maximum likelihood (ML) Viterbi sequence detector) to detect estimated binary sequence ^b(n) on line 33. RLL decoder 36 decodes estimated binary sequence into estimated user data on line 37. In the absence of errors, estimated binary sequence ^b(n) equals the recorded binary sequence 8, and decoded user data 37 equals the recorded user data 2.

Partial Erasure

At high data densities, forms of distortion in addition to intersymbol interference are present. One such form of distortion is due to partial erasure of information on the magnetic medium. This is particularly severe in regions of rapidly alternating magnetization. Partial erasure can occur, for example, when the write head attempts to magnetize a first portion of the magnetic medium in one orientation, and then attempts to magnetize a second closely adjacent portion with the opposite orientation.

Figure 3A:
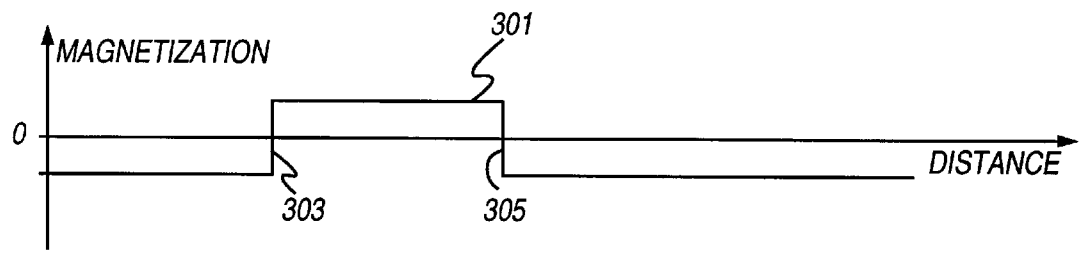
FIGS. 3A, 3B, and 3C illustrate the effects of partial erasure in a magnetic recording medium.
Figure 3B:
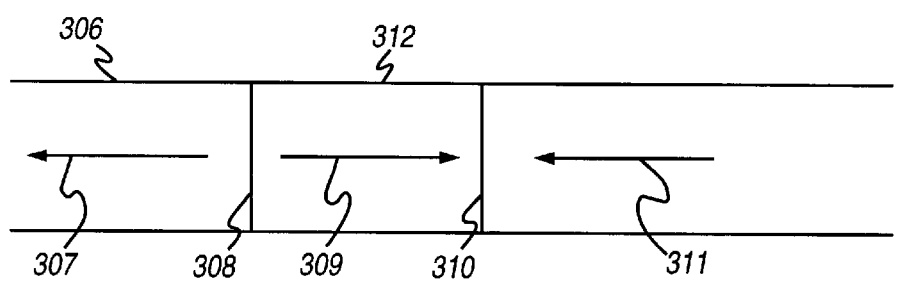
Figure 3C:
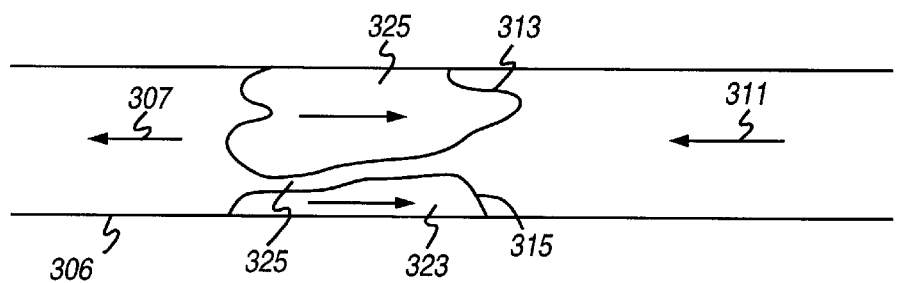

FIGS. 3A to 3C illustrates partial erasure in a magnetic medium. FIG. 3A shows an idealized plot of magnetization level 301 against distance for two successive magnetization transitions in the magnetic medium: A first transition occurs at position 303, and a second transition occurs at point 305. FIG. 3B is a schematic representation of magnetic medium 306 showing how, ideally, the magnetization in the medium corresponds to the idealized transitions. Specifically, arrow 307 represents a south-north orientation of the magnetization corresponding to the negative polarity of magnetization 301 before time 303. Similarly, arrow 309 represents a north-south orientation corresponding to the positive polarity of magnetization 301 between times 303 and 305. Boundaries 308 and 310 define region 312 with magnetic orientation given by arrow 309. Ideally, each region is magnetized to saturation in its specific orientation.

In practice, boundaries between regions of opposite magnetic orientation are not as straight and well defined as boundaries 308 and 310 shown in FIG. 3B. Instead, as illustrated in FIG. 3C, boundaries 313 and 315 are irregular, and may even include isthmuses such as isthmus 325 linking regions of like orientation across a region of opposite orientation, thereby splitting that region into multiple sub-regions and reducing the effective width of the saturated magnetic medium. For example, isthmus 325 separates region 312 into two regions 323 and 325, and the combined width of these regions is less than the width of medium 306. In addition, in practice, transitions from one orientation to another are not abrupt, but are gradual. Since voltage pulses produced by read heads as they pass over the magnetic medium are determined by the rate of change of magnetic transitions, the main effect of the deviations of actual partially erased transitions from the ideal is to reduce the amplitude of these voltage pulses.

A simple model used to describe this effect asserts that a pulse that would normally have unit amplitude has its amplitude reduced to A when it has one neighboring transition, and has its amplitude reduced to B when it has two neighboring transitions (i.e., when it is surrounded on both sides by transitions). This increases the number of valid levels in the absence of noise that can be produced on line 25 at the output of sampling device 24 in machine 100. Thus, unlike PR4 without partial erasure which has valid sample amplitudes of −1, 0, and +1, PR4 in the presence of partial erasure has valid sample amplitudes of −1, −A, A−B, 0, B−A, A, and 1. This model is equivalent to the one described in "Modified Maximum Likelihood Sequence Estimation in a Simple Partial Erasure Model," by I. Lee, T. Yamauchi, and J. M. Cioffi, *IEEE International Conference on Communications*, May 1–5, 1994, New Orleans, that is, if A=$\gamma$ and B=$\gamma^2$. The reduction in amplitude is neither causal nor linear: each transition affects other transitions that occur before or after it in time, and the extent to which the amplitude is reduced depends on the data stored in the medium. An effective way to model the magnetic recording channel in the presence of partial erasure is by means of a state machine.

State Machine Representation with Partial Erasure

In the absence of partial erasure, the output of a magnetic recording channel is determined by the history of the magnetization over which the read head has passed. In the case of a PR4 system, which is characterized by the polynomial 1−$D^2$, all of the relevant history is captured in the most recent two bits of data. Thus, this system can be represented as a state machine with the following $2^2$=4 states: 00, 01, 10, and 11.

In the presence of partial erasure of adjacent transitions, however, more history must be maintained in order to characterize every allowable state of the channel. In particular, assuming that each transition is influenced only by immediately adjacent transitions, and not by more distant transitions, a total of four bits, or sixteen states, captures all allowable states of a state machine describing the behavior of a PR4 channel with partial erasure.

Each state of such a state machine can, therefore, be denoted by a four-digit binary state label, or more conveniently, by a three-digit ternary state label of the form $s_{k-2}s_{k-1}s_k$ that may, for example, represent the amplitude and polarity of the current and two previous samples. As the machine moves from state to state, the digits in the state label shift to the left, and the ternary value taken on by the rightmost digit depends on the input to the channel. Thus, from any current state, there are a limited number of possible future states. For example, from state 0,0,+1, the next state must have the form 0,+1,X where X depends on the channel input. In an unconstrained channel, X can take on the values −1, 0, or +1. However, in the present context, non-zero samples must alternate in polarity. Accordingly, in this case X cannot take on the value +1. Thus, the allowable next states are 0,+1,0 or 0,+1,−1.

An additional constraint results in two possible all-zero states. Since non-zero samples must alternate in polarity, if the state machine is in an all-zero state that was preceded some time in the past by a negative transition, it can only move in the future back to the same all-zero state, or else to the state 0,0,+1; the future state 0,0,−1 violates the requirement that transitions must alternate in polarity. The label (−)0,0,0 will be used to denote the all-zero state that was preceded some time in the past by a negative transition. Similarly, if the state machine is in an all-zero state that was preceded some time in the past by a positive transition, it can only move in the future back to the same all-zero state, or else to the state 0,0,−1. The label (+)0,0,0 will be used to denote the all-zero state that was preceded some time in the past by a negative transition. Table 2 lists all of the states that are allowable by a PR4 channel with partial erasure.

Figure 4:
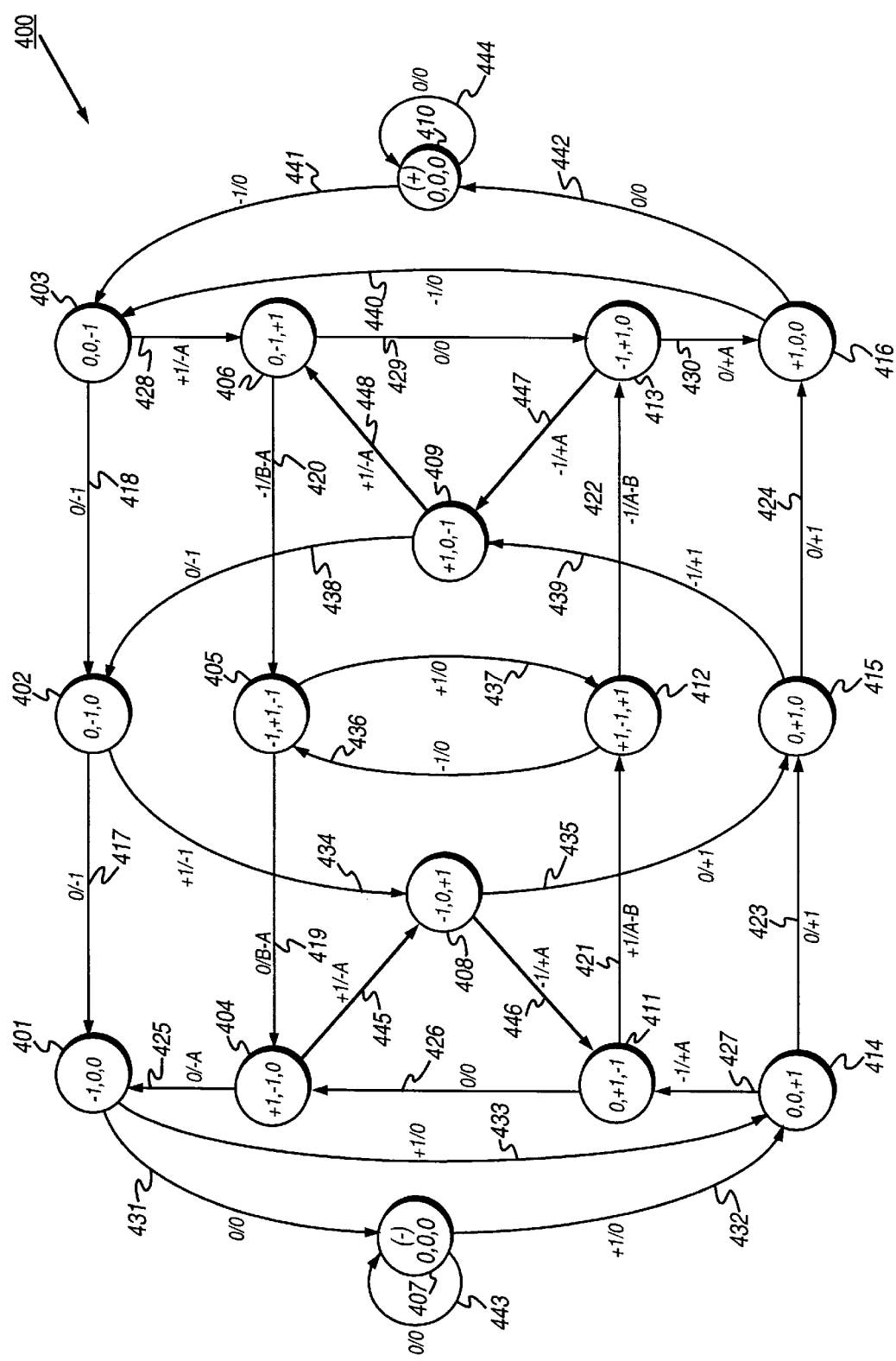
FIG. 4 shows a state machine representation of a signal model for a PR4 d=0 signal including the effects of partial erasure, the machine having sixteen states.

The constraints on the allowable states and allowable state transitions for a PR4 channel with partial erasure can now be used to construct a state machine that describes the channel's behavior. FIG. 4 shows such a state machine 400 that comprises sixteen states, 401 through 416, interconnected by branches 417 through 448. Each state has an appropriate three-digit ternary label from Table 2, and each branch has a label of the form a/b where a is the transition that leads to the corresponding state change, and b is the corresponding channel output.

Figure 5A:
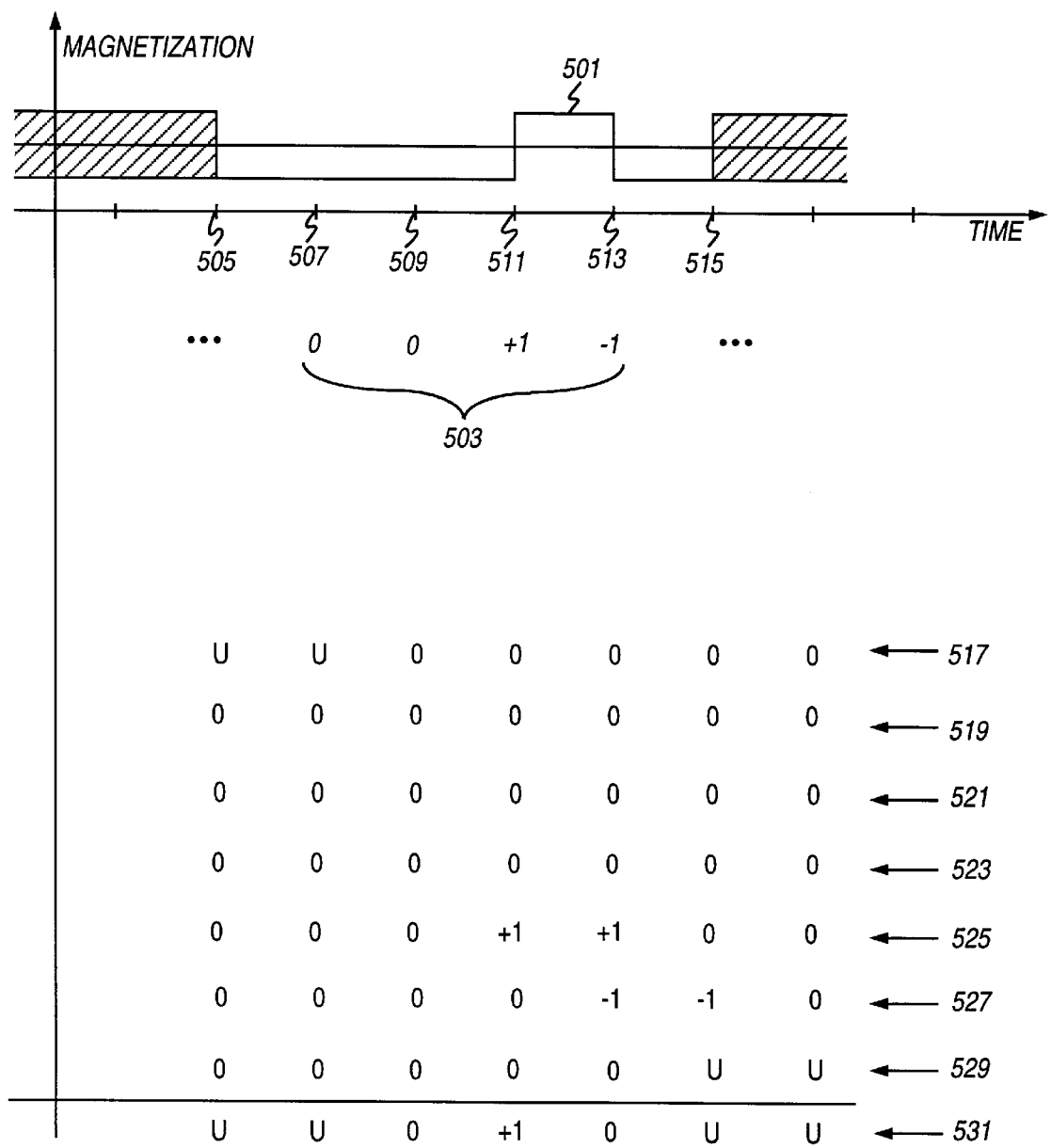
FIG. 5A illustrates how the signal model of FIG. 4 can be used to compute an output of a channel caused by a magnetic transition in the absence of partial erasure.

To compute the channel output b in the absence of partial erasure as the state machine moves from state to state, observe that each +1 transition read from the magnetic medium gives rise to a channel response comprising two +1 samples in a string of zeros. Similarly, each −1 transition read from the magnetic medium gives rise to a channel response comprising two −1 samples in a string of zeros. When sequential ternary digits are read from the magnetic medium, the individual responses from adjacent ternary digits interfere with one another, and the net channel output is a superposition of the interfering pulses. Thus, for example, FIG. 5A shows a set of information pertinent to a transition in the state machine from state 0,0,+1 to state 0,+1,0. Magnetization 501 is an idealized representation of the actual magnetic medium's magnetization corresponding to this transition, and sequence 503 represents the idealized transition sequence in signed non-return to zero inverse (SNRZI) form that spans the transition. The "+1" in sequence 503 corresponds to the rising edge in magnetization 501, and the "−1" corresponds to the falling edge in magnetization 501.

Consider now the effects of the transitions in sequence 503. The "+1" transition at time 511 generates sequence 525, and the "−1" transition at time 513 generates sequence 527. Similarly, the two zero-amplitude transitions at times 507 and 509 generate sequences 521 and 523, which are strings comprising all zeros.

Although transitions in magnetization 501 actually occur at certain physical displacements, and not at any particular times, they can be arbitrarily aligned in time with the sequences that they generate. For convenience, in FIG. 5A, the transitions in magnetization 501 are aligned in time with the first non-zero samples in the sequences that they generate. Thus, the "+1" transition is said to occur at time 511 and is aligned with the first non-zero sample that it causes in sequence 525.

Using this definition of time alignment, the magnetization before time 505 is unknown. Thus, the amplitude of the transition, if any, at time 505 is unknown. Let the variable U denote the unknown transition amplitude. Due to the presence of intersymbol interference, this transition of unknown amplitude will generate sequence 517 with two unknown samples. Similarly, a transition of unknown amplitude at time 515 will generate sequence 529. Since the sequences resulting from each transition have at most two consecutive non-zero samples, transitions before time 505 and after time 515 will not affect the output of the channel between time 507 and time 515.

Sequence 531 is the channel output sequence; it is a superposition of all of the individual sequences resulting from magnetization transitions. Specifically, the channel output at time 505 is the superposition of many zero amplitude samples, and one sample of unknown amplitude. Thus the channel output at time 505 is unknown. Similarly, the channel output at time 507 is the superposition of many zero amplitude samples, and one sample of unknown amplitude, and is, therefore, also unknown. In contrast, the channel output at time 509 is known: it is "0" because it is the superposition of many "0" samples. Similarly, the channel output at time 511 is known: it is a "1" because it is the superposition of many "0" samples and one "1" sample. Likewise, the output at time 513 is "0" because it is the superposition of many "0" samples, one "+1" sample, and one "−1" sample. Beyond time 513, the superposition contains samples with unknown amplitude, and the channel output is therefore unknown.

In summary, in the absence of partial erasure, the output of the channel as the state machine moves from state 0,0,+1 to state 0,+1,−1 as a result of reading the "−1" is the superposition of sequences 517, 519, 521, 523, 525, 527, and 529 at time 511. Specifically, the output is the "+1" sample at time 511 in sequence 531.

The preceding discussion is now extended to the case where partial erasure is present. In this case, any transition that has one neighboring transition has its amplitude scaled by a factor A, and any transition that has two neighboring transitions has its amplitude scaled by a factor B. This effect works both forward and backward along the magnetic medium.

Figure 5B:
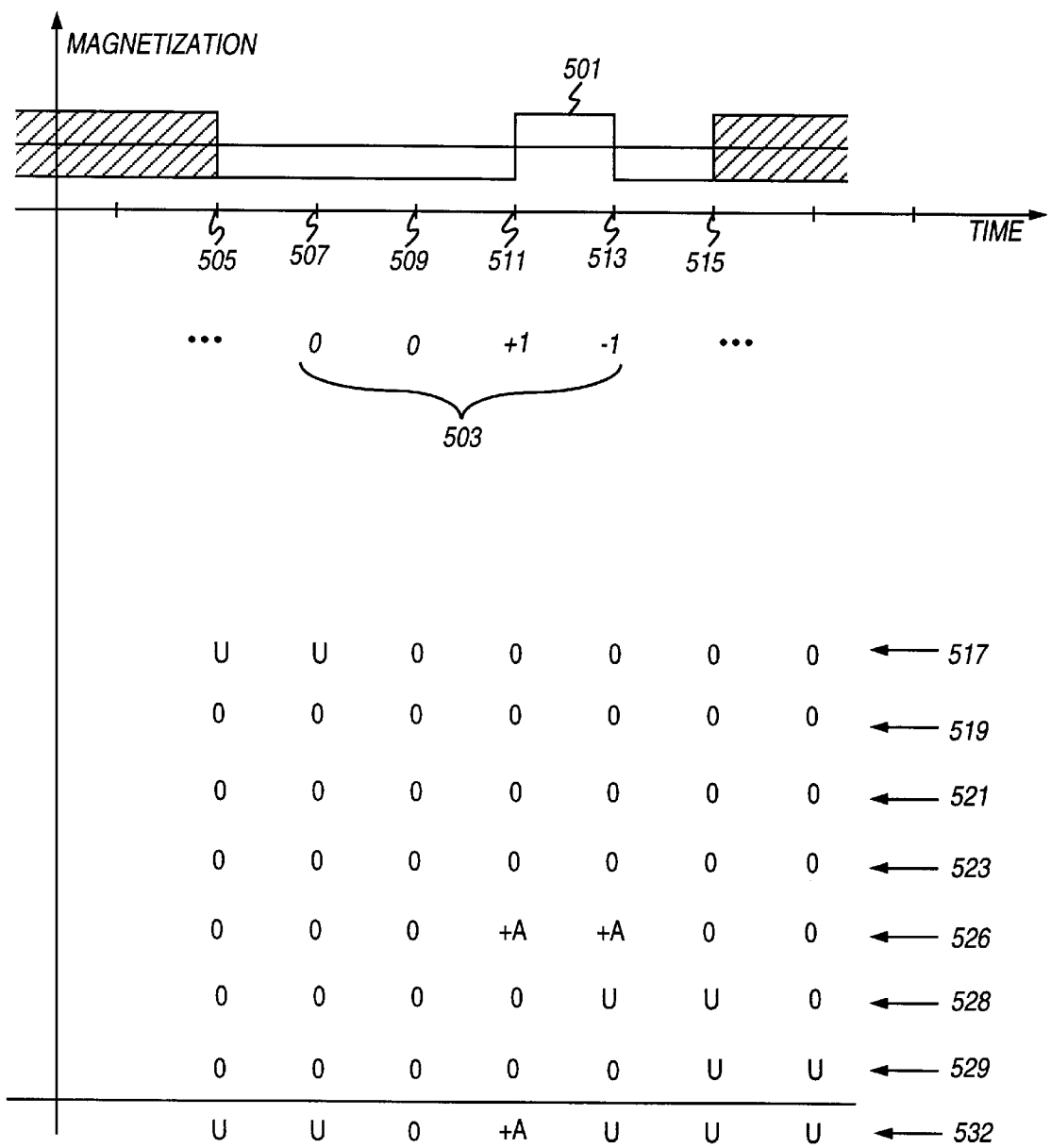
FIG. 5B illustrates how the signal model of FIG. 4 can be used to compute an output of a channel caused by a magnetic transition with one neighboring transition in the presence of partial erasure.

FIG. 5B shows an analogous set of information to that of FIG. 5A, except that the information relates to a channel with partial erasure, and specifically to the case where a particular transition has one neighboring transition. Sequences 526, 528, and 532 in FIG. 5B replace sequences 525, 527, and 531 in FIG. 5A, respectively. Sequence 526 differs from sequence 525 in that the samples with amplitude "+1" are replaced by samples with amplitude "+A" because the transition at time 511 has one neighboring transition; i.e., the transition at time 513. Sequence 528 differs from sequence 527 in that the samples with amplitude "−1" are replaced by samples with unknown amplitude. This is explained as follows. The transition, if any, at time 515 is unknown. Thus, the partial erasure scaling effect on the transition at time 513 is unknown, and hence the amplitudes of the samples in sequence 528 at times 513 and 515 are unknown.

In the presence of partial erasure, the output of the channel as the state machine moves from state 0,0,+1 to state 0,+1,−1 as a result of reading the "−1" is the superposition of sequences 517, 519, 521, 523, 526, 528, and 529 at time 511. Specifically, the output is the "+A" sample at time 511 in sequence 532.

Figure 5C:
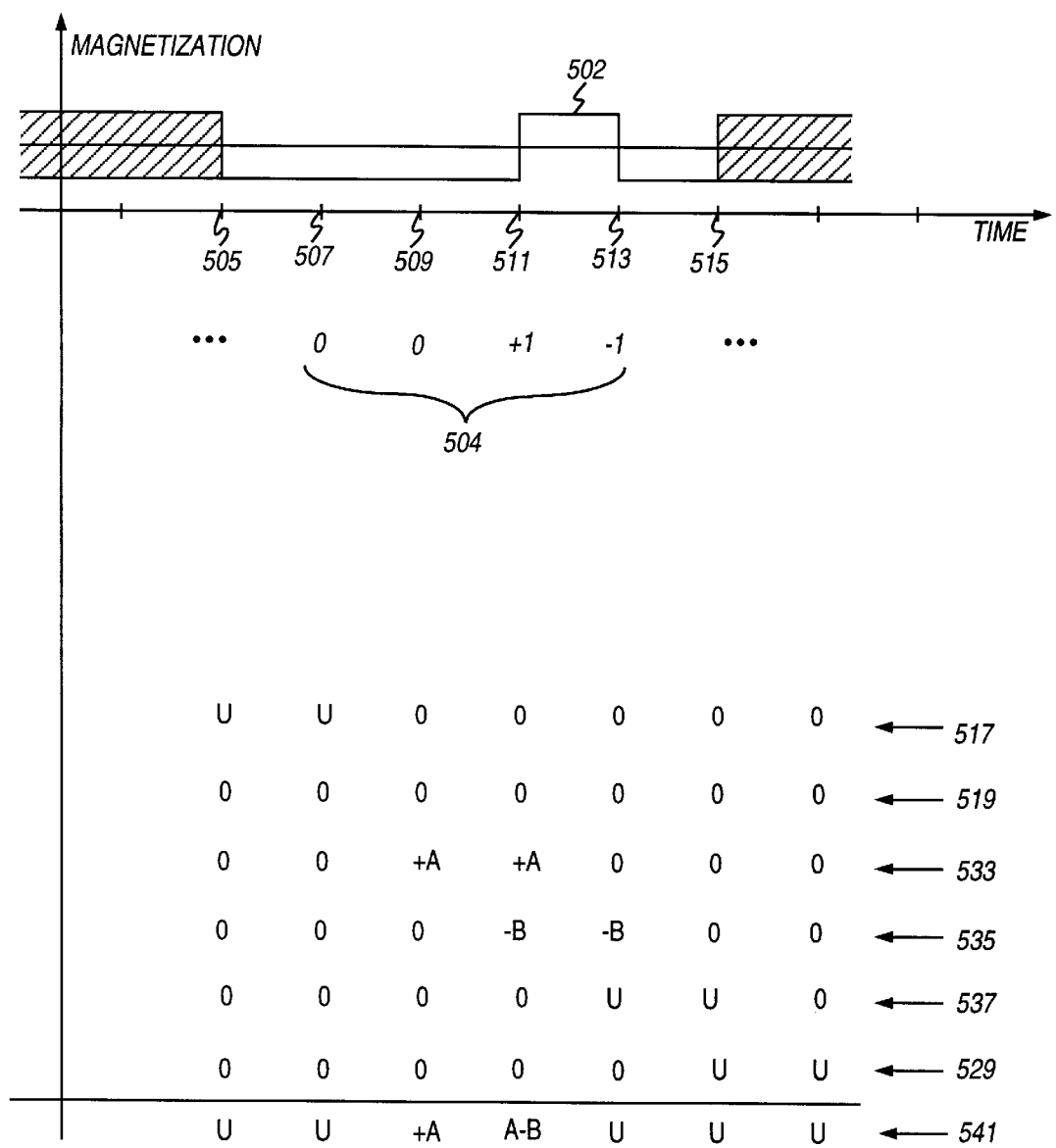
FIG. 5C illustrates how the signal model of FIG. 4 can be used to compute an output of a channel caused by a magnetic transition with two neighboring transitions in the presence of partial erasure.

FIG. 5C shows an example of a set of transitions in which a transition of interest has two neighboring transitions. In this case, as indicated by magnetization 502 and transition sequence 504, the state machine is moving from state 0,+1,−1 to state +1,−1,+1. The transition at time 509 generates sequence 533. The two non-zero samples in sequence 533 have amplitude "+A" because the transition at time 509 is a positive transition with one neighboring transition at time 511. The transition at time 511 generates sequence 535. The two non-zero samples in sequence 535 have amplitude "−B" because the transition at time 511 is a negative transition with two neighboring transitions: one at time 509 and one at time 513. The output of the channel is the sample with amplitude "A−B" at time 511 in sequence 541. The branches in state machine 400 are labeled by repeating this procedure for computing the channel output b for every allowable state change.

Several states in machine 400 of FIG. 4 move to the same states and produce the same outputs in response to reading the same transitions. Such states are termed "output-equivalent." For example, from state 414, the machine moves to state 411 if it reads a "−1" or to state 415 if it reads a "+1". Similarly, from state 408, the machine moves to state 411 if it reads a "−1" or to state 415 if it reads a "+1". Thus, independently of whether the machine is in state 414 or state 408, it will move to state 411 or state 415, depending only on the transition read. States 414 and 408 are, therefore, output-equivalent and can be merged into one state without any effect on the state machine's operation. Analogously, states can also be merged if they are input-equivalent. By merging states, the total number of states can be reduced significantly. However, the minimum number of merged states depends on the labeling chosen for the branches.

Figure 6:
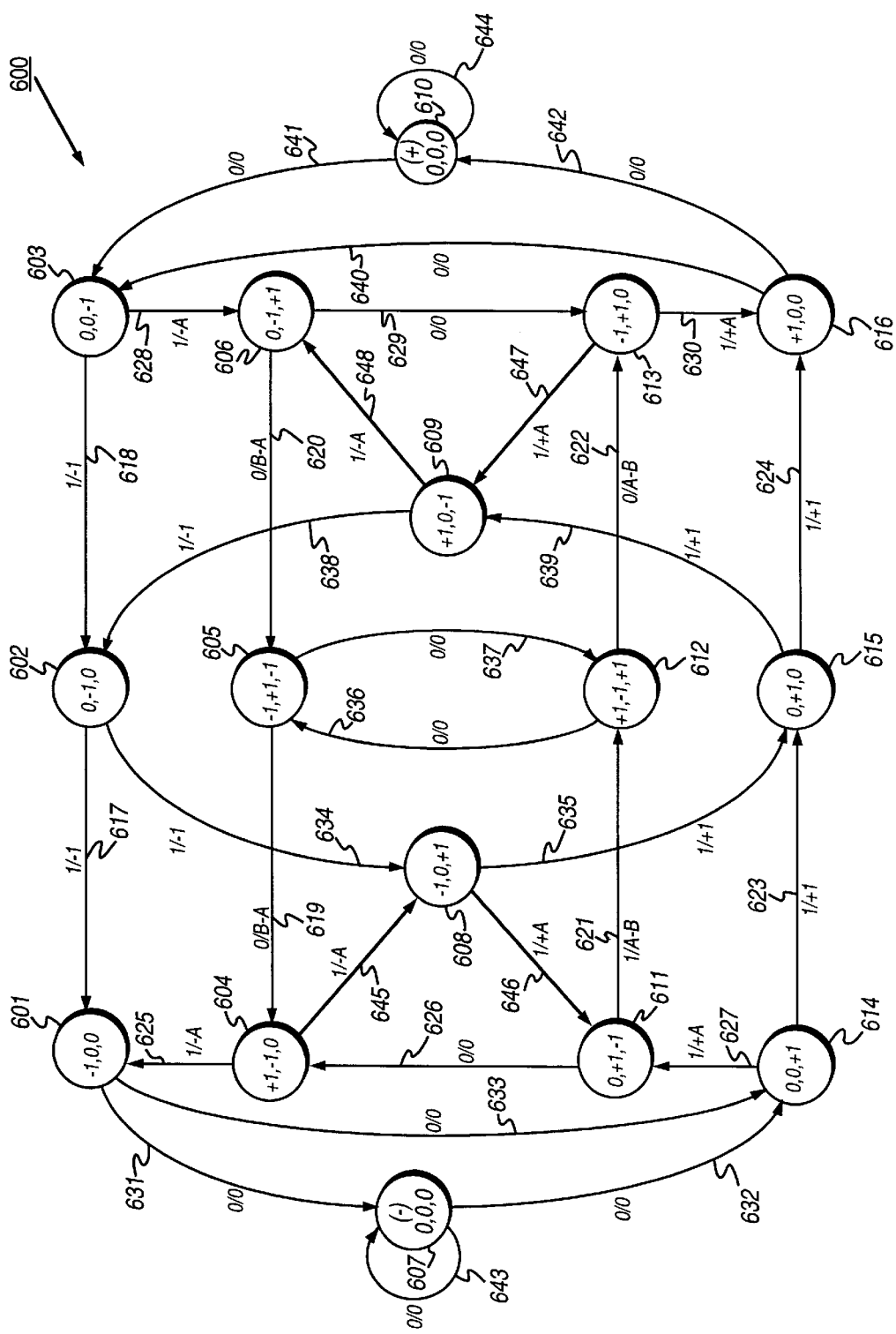
FIG. 6 shows the state machine of FIG. 4 with branches re-labeled in interleaved non-return to zero inverse (INRZI) format.

One aspect of the present invention is a minimal state representation derived from state machine 400 by re-labeling all branches in INRZI form rather than SNRZI form, and by merging all input- and output-equivalent states. FIG. 6 shows state machine 600 that has the same topology as state machine 400, but all branches have been re-labeled in INRZI form. State machine 600 has more input- and output-equivalent states than state machine 400.

FIG. 7A shows state machine 700 which is a result of a first step in reducing the number of states in state machine 600. Specifically, states 608 and 614 are output-equivalent and have been merged into state 701, allowing branches 635 and 646 to be removed. Similarly, states 602 and 609 are output-equivalent, and have been merged into state 703, allowing branches 638 and 648 to be removed. Branches 705, 707, 709, and 711 replace branches 634, 639, 645, and 647, respectively. Similarly, FIG. 7B shows state machine 750 that is derived from state machine 700 by merging output-equivalent states 607 and 601 into state 721, and states 610 and 616 into state 723. One aspect of the present invention, state machine 770 shown in FIG. 7C, is derived from state machine 750 by merging input-equivalent states 701 and 721 into state 771, and input-equivalent states 703 and 723 into state 773. State machine 790 shown in FIG. 7D is the same as state machine 770, but machine 790 has been redrawn for clarity.

Although the state machine shown in FIG. 7D explicitly represents a model of a particular partial response signal, it also implicitly represents a sequence detector that is used to detect (or demodulate) required digital data from the signal. To use the described state machine model as a sequence detector, one assigns a path metric to each path through the state machine. The path metric represents an error associated with a distance between the actual received signal and the model signal defined by the path under consideration. The optimum data is the data that corresponds to the model signal (or equivalently, the path through the state machine) that has the smallest path metric. The Viterbi algorithm is an efficient method for finding the smallest path metric. Thus, the state machines described above represent both signal models and sequence detectors, and one skilled in the art would be capable of producing a sequence detector from the state machine diagrams. In the current context, when state machines are regarded as sequence detectors, each state is construed to be a component known as an add-compare-select (ACS) module.

The method described above for deriving sequence detectors for PR4 d=0 read channels matched to partial erasure can be used to derive analogous read channels comprising sequence detectors which operate according to a state machine matched to partial erasure and a coding scheme or constraint which increases a minimum distance error event of the sequence detector. An example of such a coding scheme is provided by J. Moon and B. Brickner in "Maximum Transition Run Codes for Data Storage Systems," *IEEE Intermag* '96. In the present invention, the preferred code constraint for increasing the minimum distance error event of the sequence detector is an RLL d=1 constraint.

Thus, the methods described above for deriving sequence detectors for PR4 d=0 read channels in the presence of partial erasure are used to derive analogous sequence detectors which operate according to the d=1 constraint. For example, FIG. 8 shows a state machine representation of a signal model, or equivalently for a sequence detector, for an EPR4 d=1 read channel including the effects of partial erasure. Similarly, FIG. 9 shows a state machine representation of a signal model, or equivalently for a sequence detector, for an EEPR4 d=1 signal including the effects of partial erasure.

A more efficient implementation of sequence detectors can be achieved if one is prepared to sacrifice a small amount of performance and to increase slightly the complexity of some ACS modules by allowing those modules to represent shared states. A method for achieving increasing efficiency in this way is described in U.S. Pat. No. 5,291,499 entitled "Method and Apparatus for Reduced-Complexity Viterbi-Type Sequence Detectors." In the present invention for a PR4 d=0 signal, this method is most effectively applied to a state machine derived from state machine 790 by the process colloquially named "squaring the machine." Such squaring produces an alternative representation of the state machine that processes more than one sample at any instant. This may enable faster processing, but at the expense of more computational complexity. Machine 1000 shown in FIG. 10 is such a state machine.

Machines 1000 and 790 represent the same model; they have the same states but different branches. For convenience in merging states, the state labels in FIG. 10 have been simplified. Thus, for example, state 771 is labeled (−)0,0,0 in machine 790, but is labeled 1 in machine 1000. Also for labeling convenience, the variable C=A−B has been used.

In contrast to machine 790 in which each branch is associated with only one sample of the measured signal, each branch in machine 1000 is associated with two sequential samples. Thus, for example, in machine 790, from the state labeled 1, a measured sample of "+A" leads to the state labeled 7, and a subsequent sample of "0" leads to the state labeled 4. Thus, from the state labeled 1 in machine 790, the sample sequence "+A" followed by "0" leads to the state labeled 4. Similarly, referring now to machine 1000, the branch that leads from the state labeled 1 to the state labeled 4 is associated with the sample "+A" followed by the sample "0". Thus, in both machines, from the state labeled 1, the sample "+A" followed by the sample "0" leads to the state labeled 4. Likewise, every pair of branches in machine 1000 has an equivalent single branch in machine 790.

To provide a first alternative embodiment, the number of states in machine 1000 can be reduced by applying the method of U.S. Pat. No. 5,291,499 to merge states into a smaller number of extended states. In particular, the states labeled 2, 7, and 8 can share one extended state, and the states labeled 3, 4, and 9 can share another extended state. Merging these states accordingly leads to machine 1100 shown in FIG. 11 where state 1103 represents a merged form of states labeled 2, 7, and 8. Since an extended state can represent any one of a number of states, each extended state must be equipped with memory that enables it to recognize what state it represents at any instant. The presence and operation of this memory is indicated indirectly in machine 1100 by the branch labeling. For example, if machine 1100 is currently in state 1103, then at the next sample, it can move back to state 1103, to state 1109, to state 1105, or to state 773. However, it can only move to state 773 (the state labeled 10) if state 1103 currently represents the state labeled 8 and the machine receives the samples "A,0". Accordingly, branch 1149 which represents the transition from state 1103 to state 773 has the label A,0(8,10).

Just as the extended states can represent any one of several states at any one time, some branches in machine 1100 can represent one of a number of state transitions at any one time. For example, branch 1131 can represent a path from state 2 to state 7, state 7 to state 8, or state 8 to state 2, depending on the current state represented by extended state 1103 and on the samples received.

In a second alternative embodiment, states labeled 2, 5, 7, and 8 share a first extended state, and states 3, 4, 6, and 9 share a second extended state as illustrated in machine 1200 of FIG. 12. Like each branch of machine 1100, each branch of machine 1200 can represent one or more transitions depending on the current state of the machine and on the samples received.

Thus, in summary, we have presented a number of embodiments of a sampled amplitude read channel for a PR4 d=0 signal having a sequence detector that compensates for partial erasure using less than eleven states. Further, we have presented read channels for EPR4 d=1 and EEPR4 d=1 signals having sequence detectors that compensate for partial erasure.

While preferred and alternative embodiments have been presented, it will be obvious to those skilled in the art that various changes to form and detail may be made to the invention without departing from its scope. For example, it is possible to merge states other than those merged in machines 1100 and 1200. This, and other like modifications, are within the scope of the present invention.

TABLE 1

| Channel | Transfer Function | Dipulse Response |
|---|---|---|
| PR4 | $(1-D)(1+D)$ | $0, 1, 0, -1, 0, 0, 0, \ldots$ |
| EPR4 | $(1-D)(1+D)^2$ | $0, 1, 1, -1, -1, 0, 0, \ldots$ |
| EEPR4 | $(1-D)(1+D)^3$ | $0, 1, 2, 0, -2, -1, 0, \ldots$ |

TABLE 2

ALLOWABLE STATES

| $S_{K-2}$ | $S_{K-1}$ | $S_K$ |
|---|---|---|
| (−) 0 | 0 | 0 |
| (+) 0 | 0 | 0 |
| 0 | 0 | +1 |
| 0 | 0 | −1 |
| 0 | +1 | 0 |
| 0 | −1 | 0 |
| 0 | +1 | −1 |
| 0 | −1 | +1 |
| +1 | 0 | 0 |
| −1 | 0 | 0 |
| +1 | 0 | −1 |
| −1 | 0 | +1 |
| +1 | −1 | 0 |
| −1 | +1 | 0 |
| +1 | −1 | +1 |
| −1 | +1 | −1 |

We claim:

1. A sampled amplitude read channel for reading digital data from a magnetic storage medium, comprising:

(a) a sampling device for sampling an analog read signal from a read head positioned over the storage medium to generate a sequence of discrete time sample values; and (b) a sequence detector for demodulating the digital data from the discrete time samples wherein:

(a) the sequence detector compensates for a reduction in amplitude of a primary pulse in the analog read signal caused by adjacent secondary pulses in the analog read signal; and (b) the sequence detector operates according to a code constraint which increases a minimum distance error event of the sequence detector.

2. The sampled amplitude read channel as recited in claim 1, wherein the code constraint is an RLL(d,k) constraint where d>0.

3. The sampled amplitude read channel as recited in claim 2, further comprising an equalizer for equalizing the read channel according to a response of the form $(1-D)(1+D)^n$ where n>1.

4. The sampled amplitude read channel as recited in claim 3, wherein d=1 and the sequence detector demodulates EPR4 signals in accordance with the following state machine:

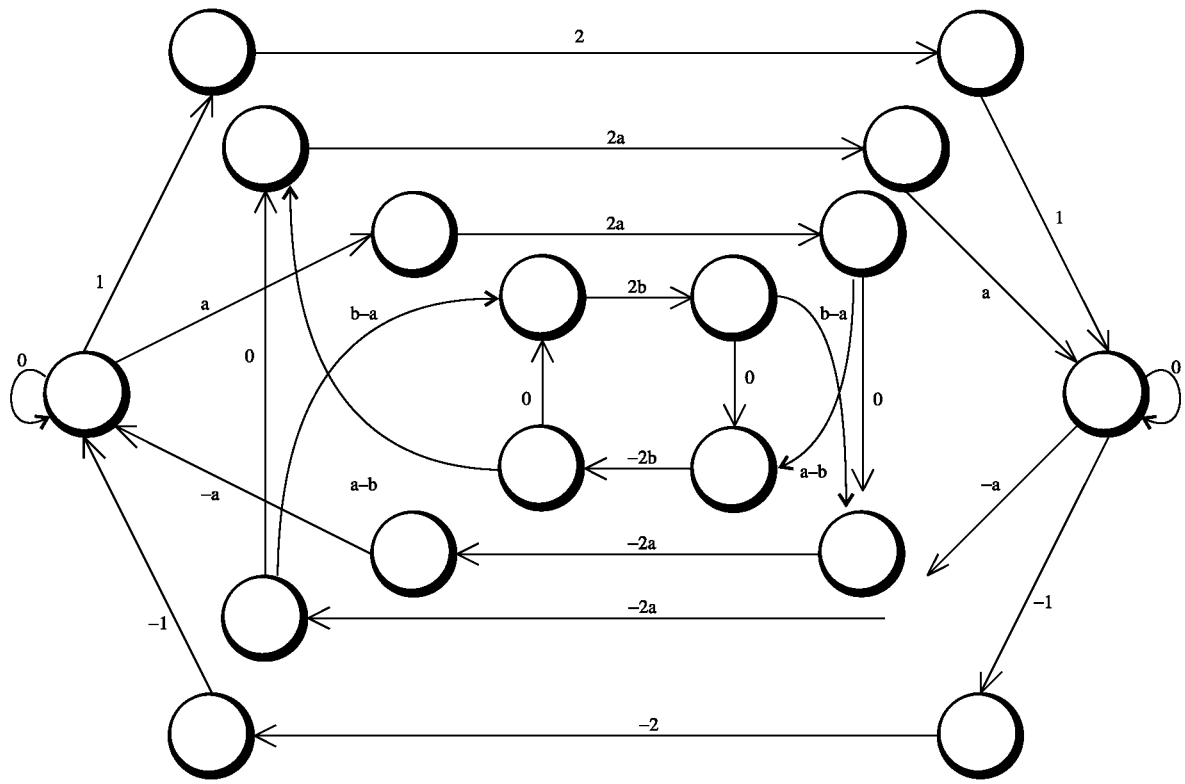

5. The sampled amplitude read channel as recited in claim 3, wherein d=1 and the sequence detector demodulates EEPR4 signals in accordance with the following state machine:

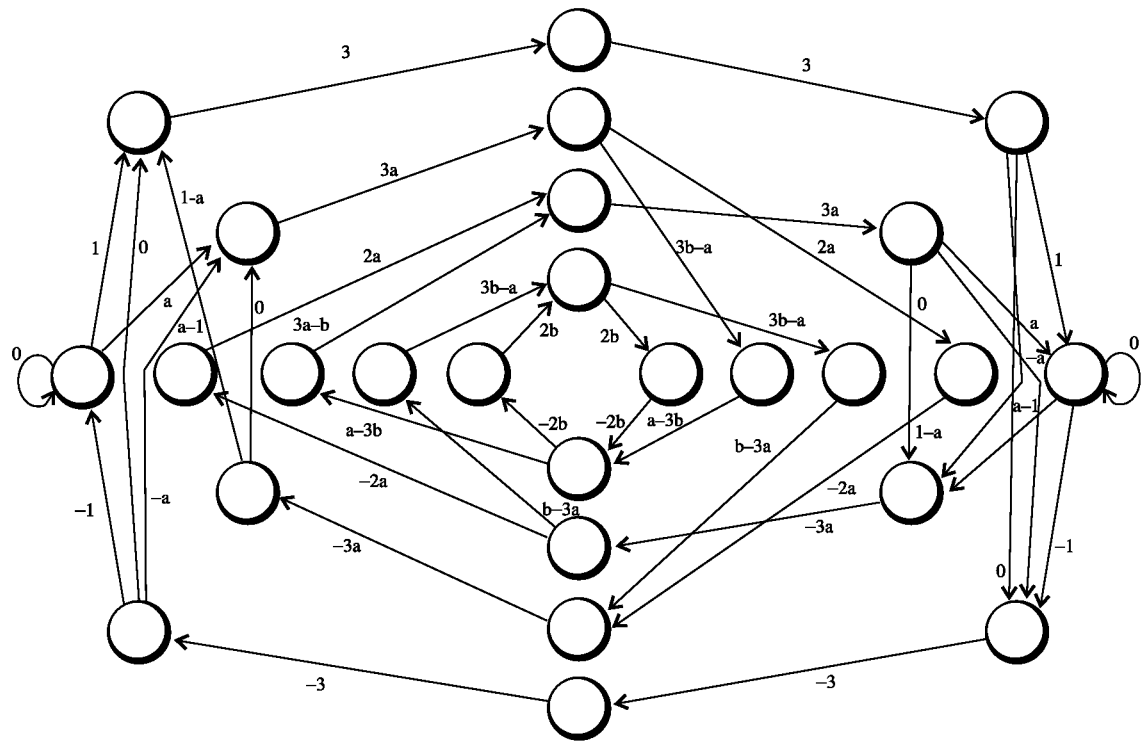

6. A sampled amplitude read channel for reading digital data from a magnetic storage medium, comprising:
   (a) a sampling device for sampling an analog read signal from a read head positioned over the storage medium to generate a sequence of discrete time sample values; and
   (b) a sequence detector for demodulating the digital data from the discrete time samples wherein:
      (a) the sequence detector compensates for a reduction in amplitude of a primary pulse in the analog read signal caused by adjacent secondary pulses in the analog read signal; and
      (b) the sequence detector operates in accordance with a state machine comprising less than eleven states.

7. The sampled amplitude read channel as recited in claim 6, wherein the sequence detector operates in accordance with the following state machine:

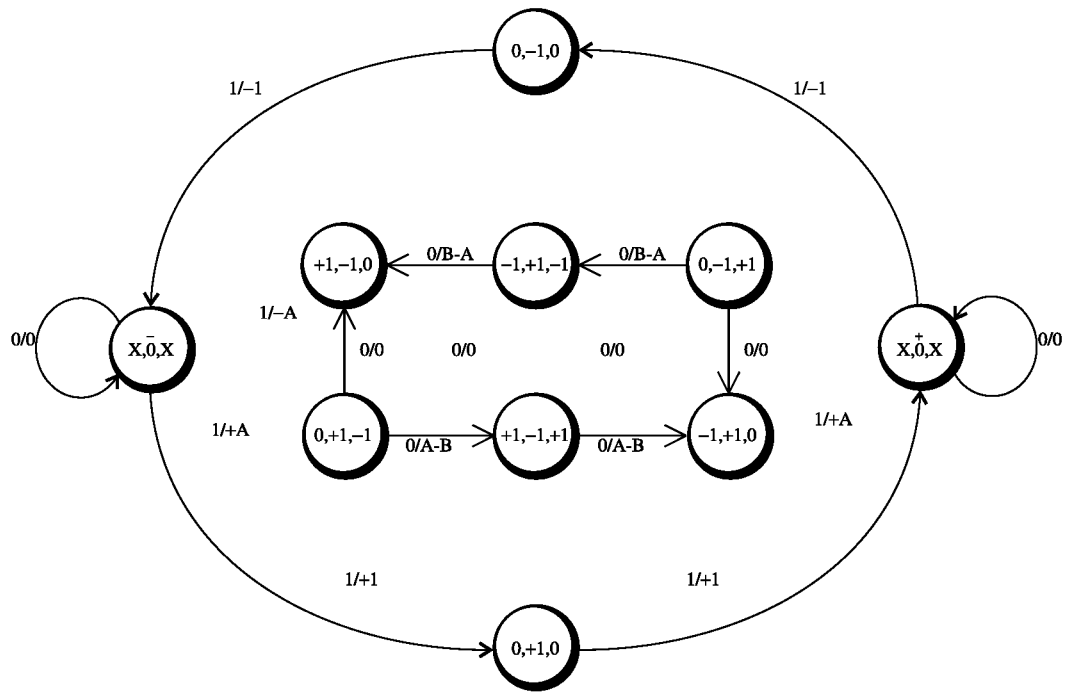
8. The sampled amplitude read channel as recited in claim 6, wherein the sequence detector operates in accordance with the following state machine:
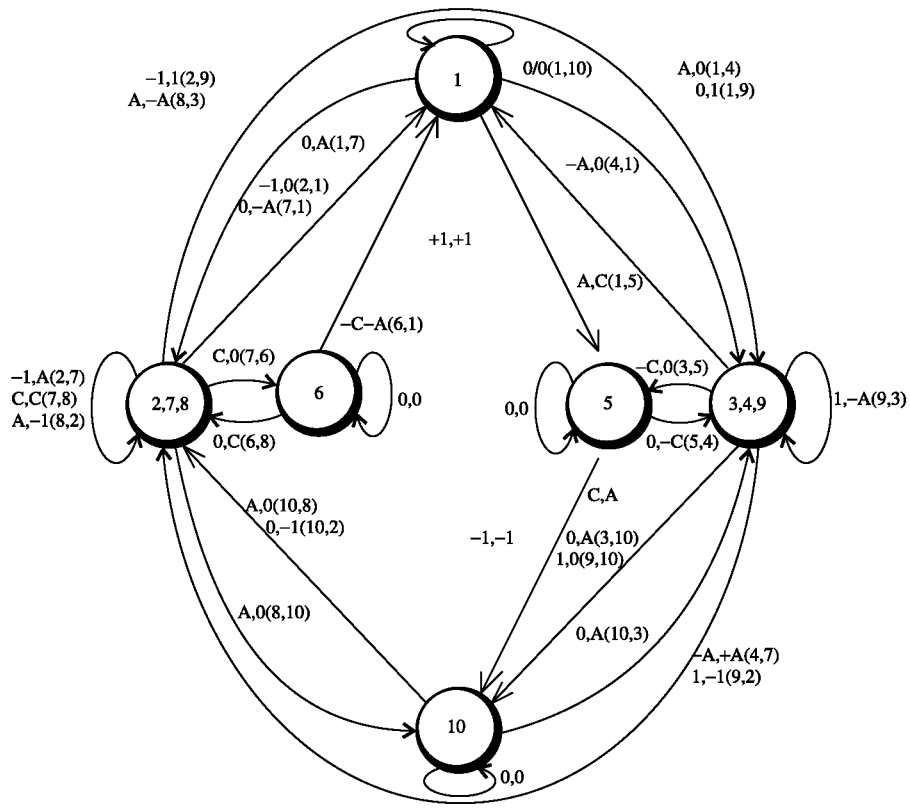

9. The sampled amplitude read channel as recited in claim 6, wherein the sequence detector operates in accordance with the following state machine:

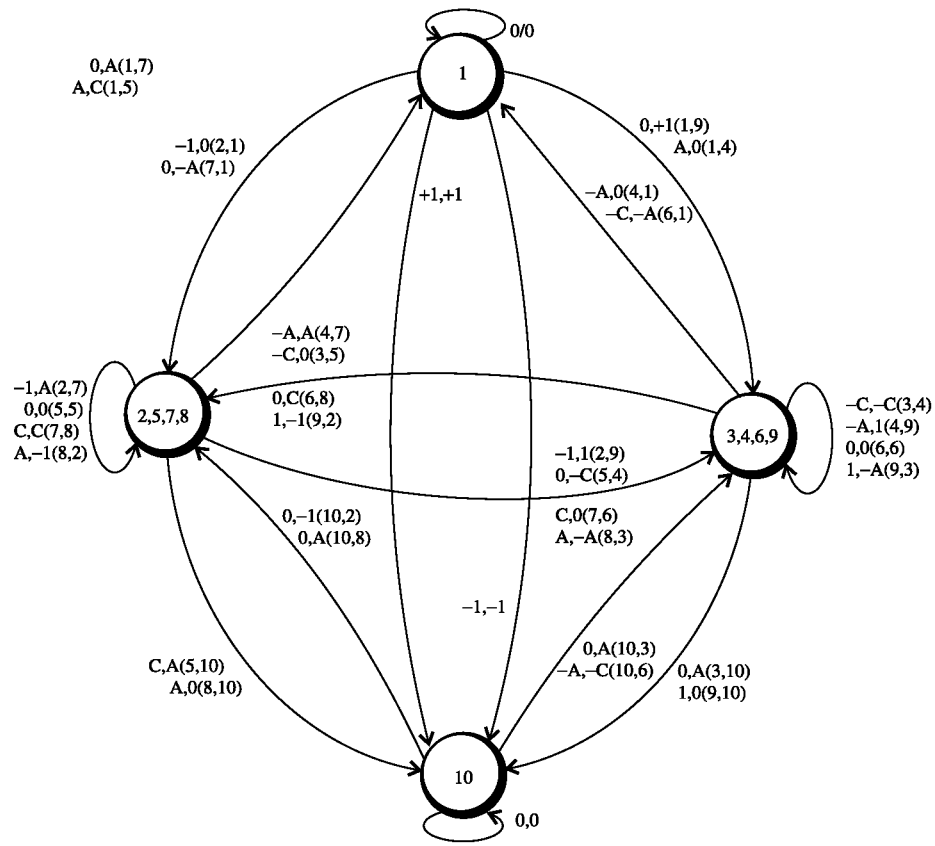

10. A sampled amplitude read channel for reading digital data from a magnetic storage medium, comprising:
   (a) a sampling device for sampling an analog read signal from a read head positioned over the storage medium to generate a sequence of discrete time sample values;
   (b) an equalizer for equalizing the read channel according to a response of a form $(1-D)(1+D)^n$ where $n>1$; and
   (c) a discrete time sequence detector for demodulating the digital data from the discrete time samples wherein the sequence detector compensates for a reduction in amplitude of a primary pulse in the analog read signal caused by adjacent secondary pulses in the analog read signal.

11. The sampled amplitude read channel as recited in claim 10, wherein n=2 and the sequence detector demodulates EPR4 signals in accordance with the following state machine:

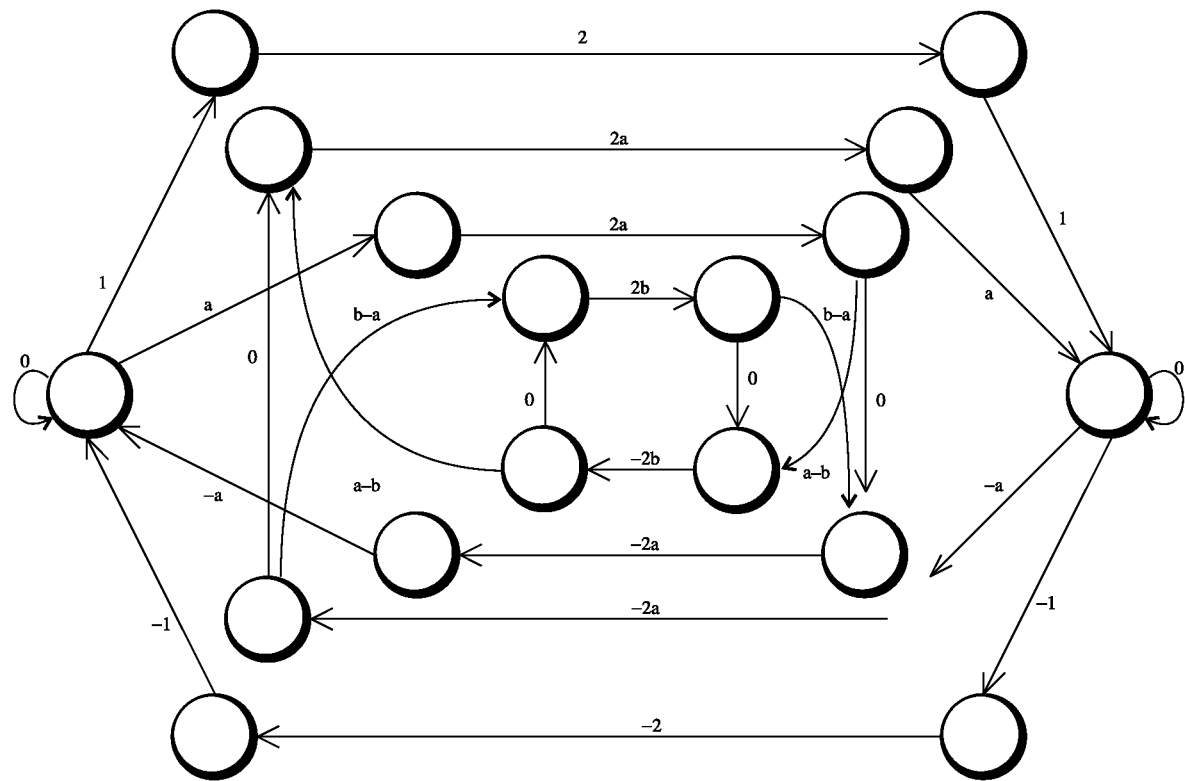
12. The sampled amplitude read channel as recited in claim 10, wherein n=3 and the sequence detector demodulates EEPR4 signals in accordance with the following state machine:
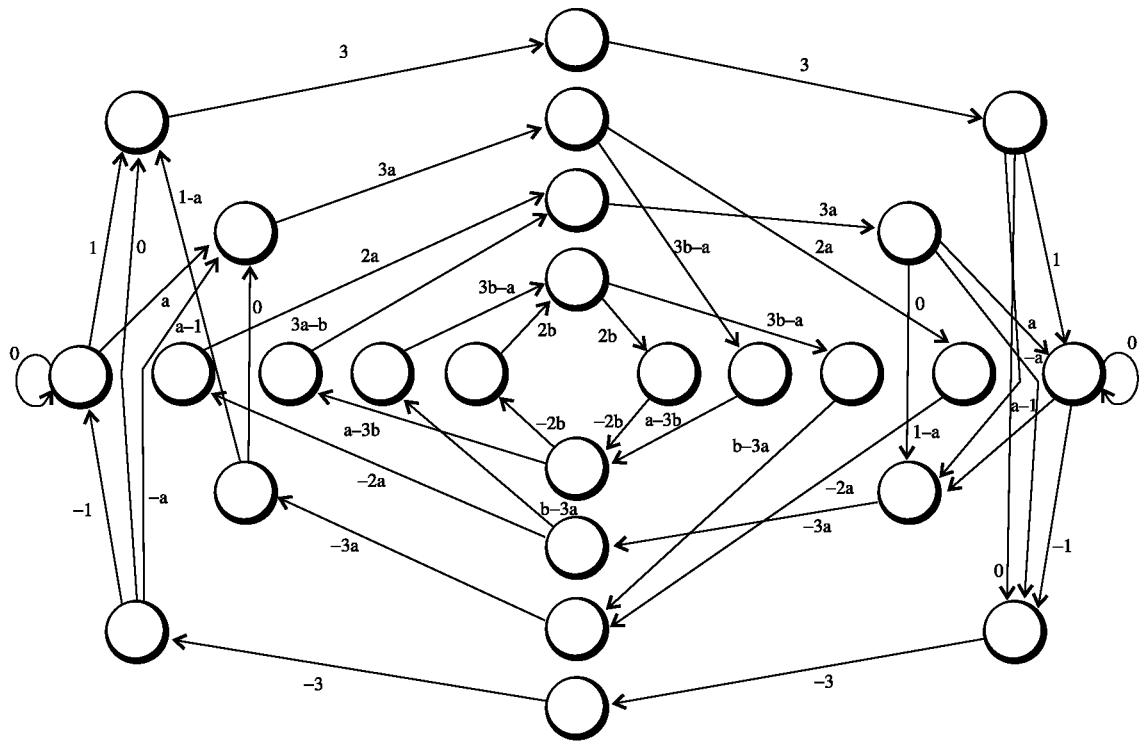

13. A sampled amplitude read channel for reading digital data from a magnetic storage medium, comprising:

(a) a sampling device for sampling an analog read signal from a read head positioned over the storage medium to generate a sequence of discrete time sample values, the sample values being characterized by a state machine model having a first number of states;

(b) a sequence detector for demodulating the digital data from the sequence of discrete time sample values, comprising a second number of add-compare-select (ACS) modules wherein:

(a) the second number is less than the first number;

(b) at least one of the ACS modules is an extended ACS module that is associated with a plurality of specific predetermined states of the state machine so that every state of the state machine has a corresponding ACS module;

(c) each one of the extended ACS modules represents a particular one state of its associated specific predetermined states at any particular time, and includes memory means for storing an identity of the particular one state; and (d) the sequence detector compensates for a reduction in amplitude of a primary pulse in the analog read signal caused by adjacent secondary pulses in the analog read signal.

14. The sampled amplitude read channel as recited in claim 13, wherein the sequence detector operates in accordance with the following state machine:

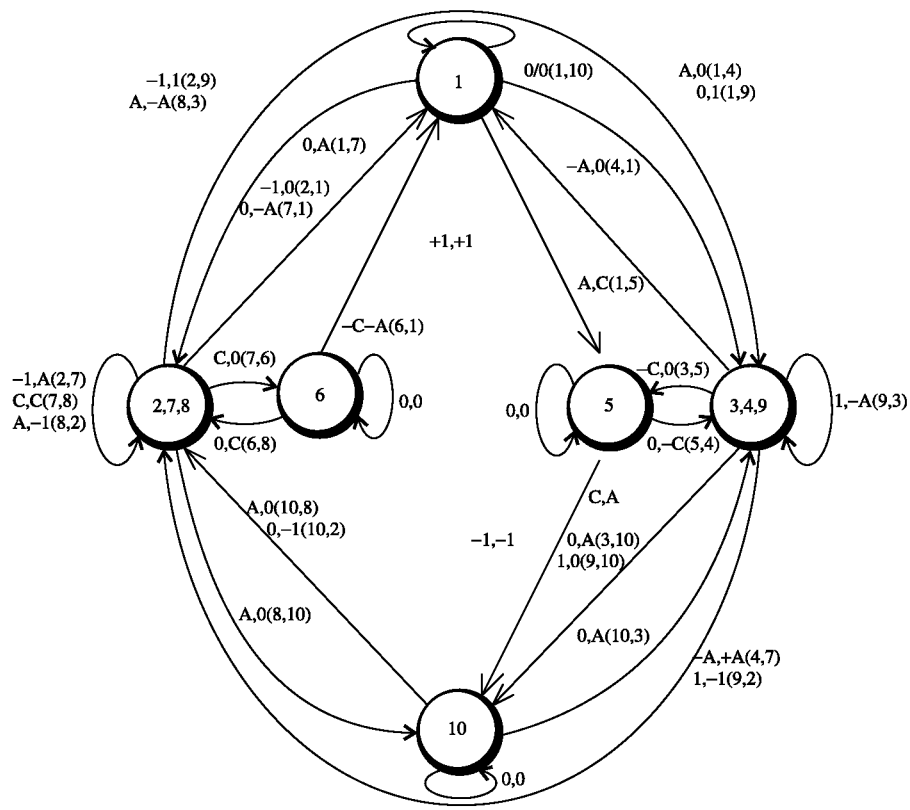

15. The sampled amplitude read channel as recited in claim 13 wherein the sequence detector operates in accordance with the following state machine:

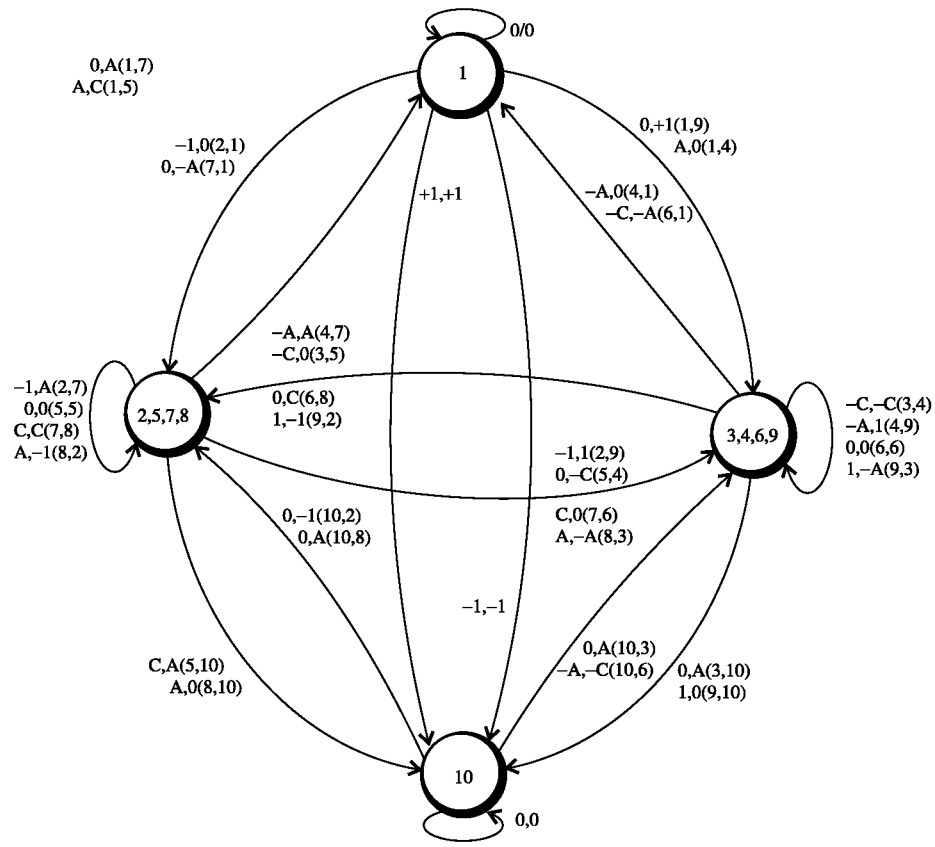
16. The sampled amplitude read channel as recited in claim 13, wherein the sequence detector operates according to a code constraint which increases a minimum distance error event of the sequence detector.
* * * * *

UNITED STATES PATENT AND TRADEMARK OFFICE
CERTIFICATE OF CORRECTION

PATENT NO : 5,862,161
DATED : Jan. 19, 1999
INVENTOR(S) : Reed et al.

It is certified that error appears in the above-identified patent and that said Letters Patent is hereby corrected as shown below:

In claim 4, the state machine should read:

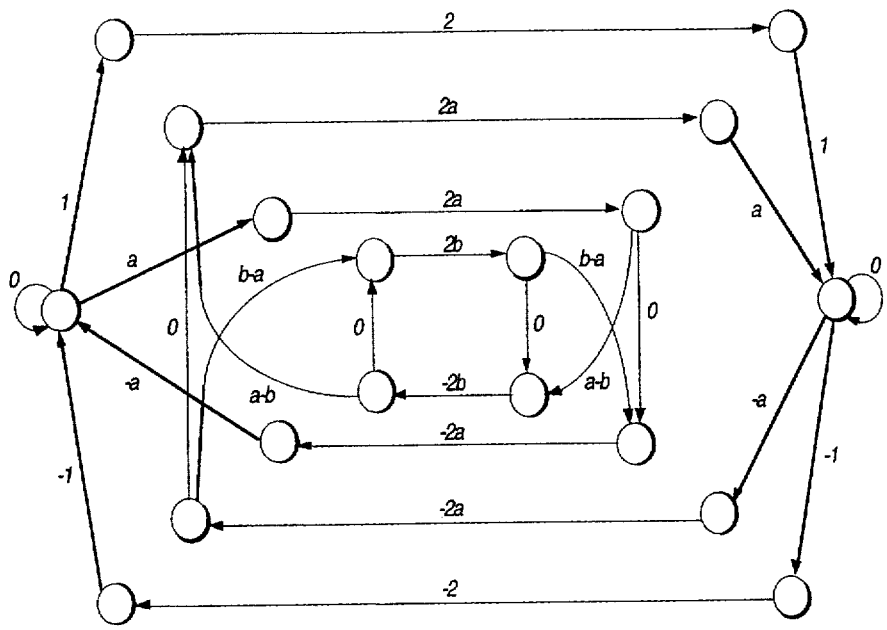

UNITED STATES PATENT AND TRADEMARK OFFICE
CERTIFICATE OF CORRECTION

PATENT NO : 5,862,161
DATED : Jan. 19, 1999
INVENTOR(S) : Reed et al.

It is certified that error appears in the above-identified patent and that said Letters Patent is hereby corrected as shown below:

In claim 5, the state machine should read:

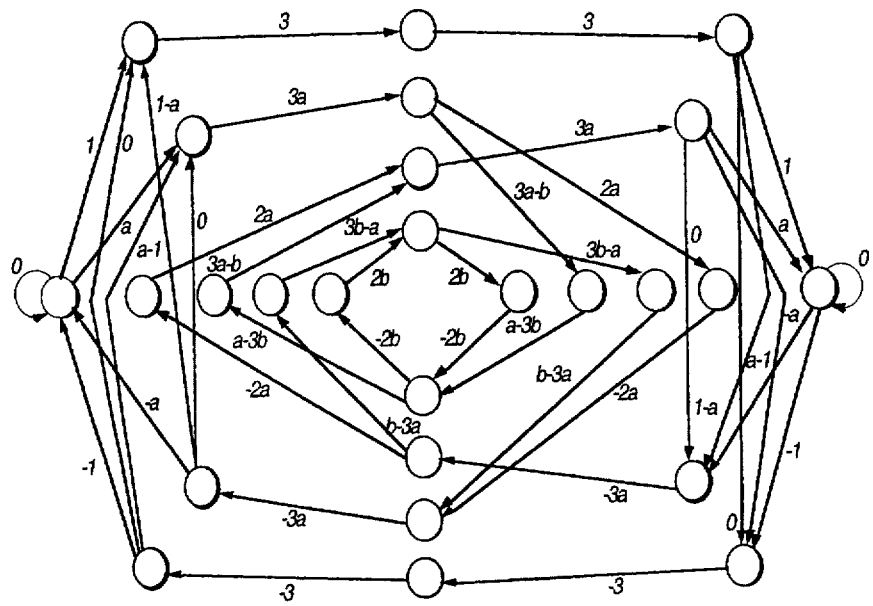

UNITED STATES PATENT AND TRADEMARK OFFICE
CERTIFICATE OF CORRECTION

PATENT NO : 5,862,161
DATED : Jan. 19, 1999
INVENTOR(S) : Reed et al.

PAGE 3 OF 9

It is certified that error appears in the above-identified patent and that said Letters Patent is hereby corrected as shown below:

In claim 7, the state machine should read:

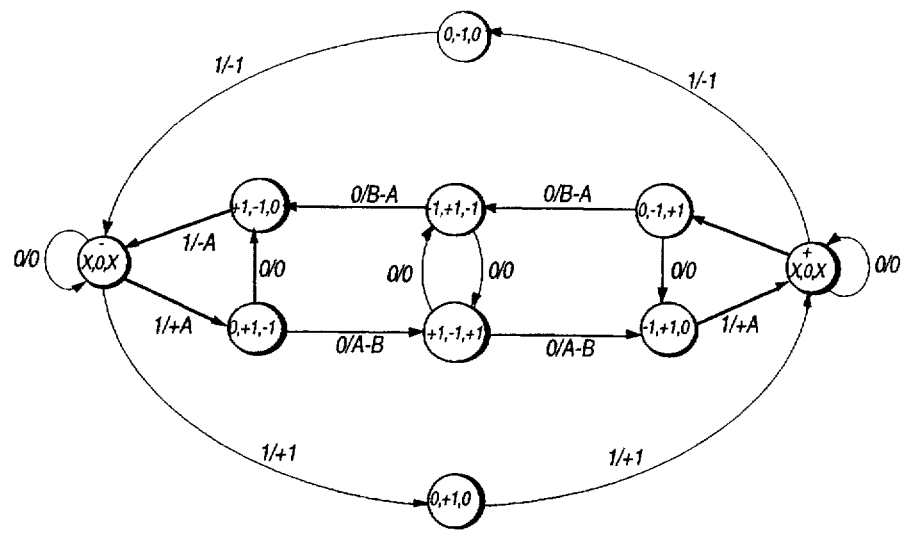

UNITED STATES PATENT AND TRADEMARK OFFICE
CERTIFICATE OF CORRECTION

PATENT NO : 5,862,161
DATED : Jan. 19, 1999
INVENTOR(S) : Reed et al.

It is certified that error appears in the above-identified patent and that said Letters Patent is hereby corrected as shown below:

In claim 8, the state machine should read:

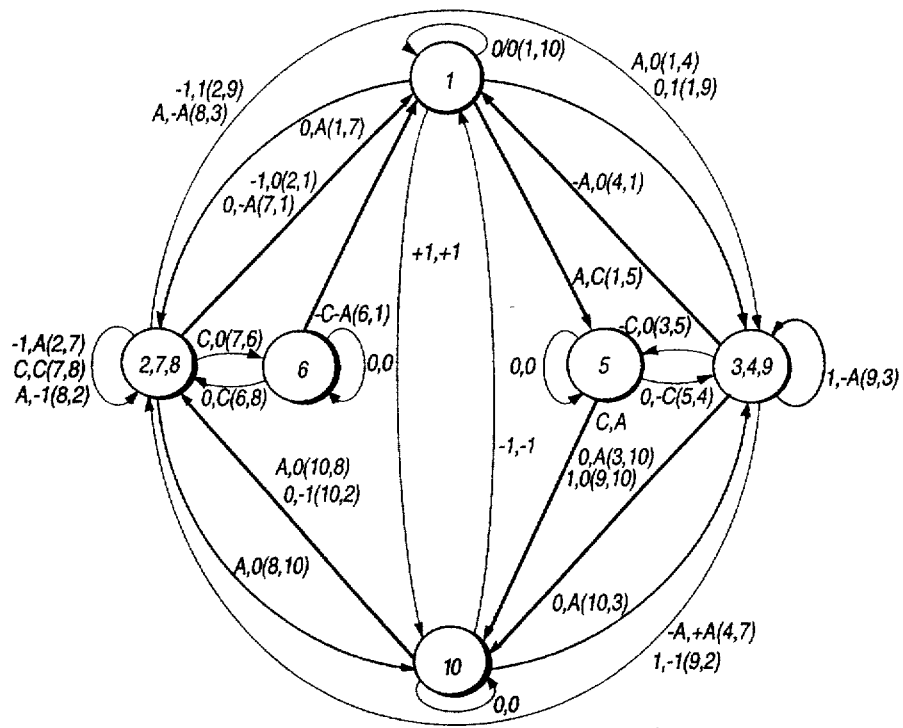

UNITED STATES PATENT AND TRADEMARK OFFICE
CERTIFICATE OF CORRECTION

PATENT NO : 5,862,161
DATED : Jan. 19, 1999
INVENTOR(S) : Reed et al.

It is certified that error appears in the above-identified patent and that said Letters Patent is hereby corrected as shown below:

In claim 9, the state machine should read:

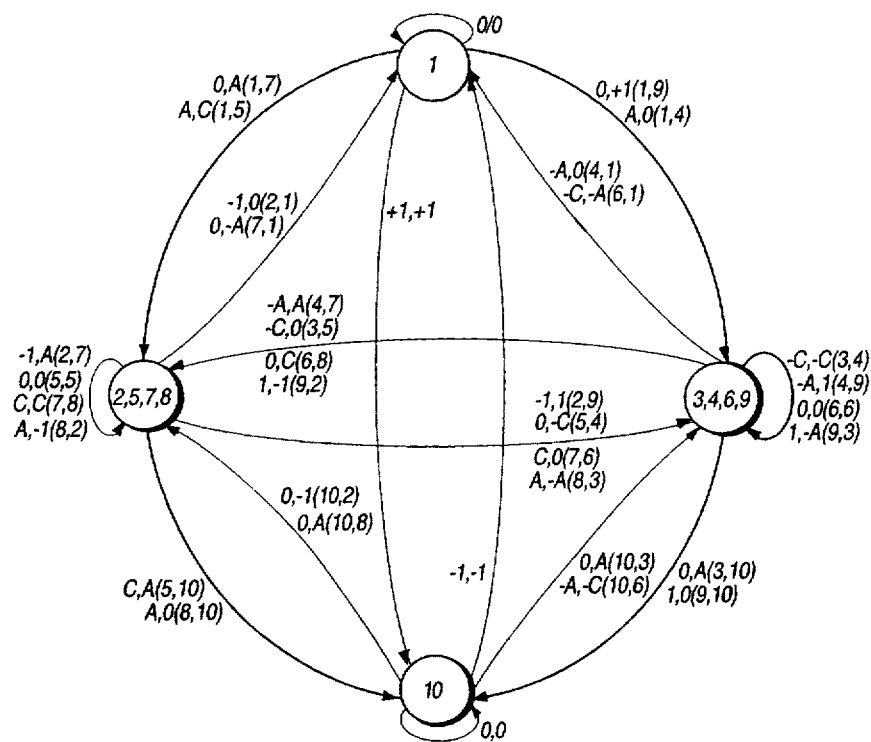

UNITED STATES PATENT AND TRADEMARK OFFICE
CERTIFICATE OF CORRECTION

PATENT NO : 5,862,161
DATED : Jan. 19, 1999
INVENTOR(S) : Reed et al.

PAGE 6 OF 9

It is certified that error appears in the above-identified patent and that said Letters Patent is hereby corrected as shown below:

In claim 11, the state machine should read:

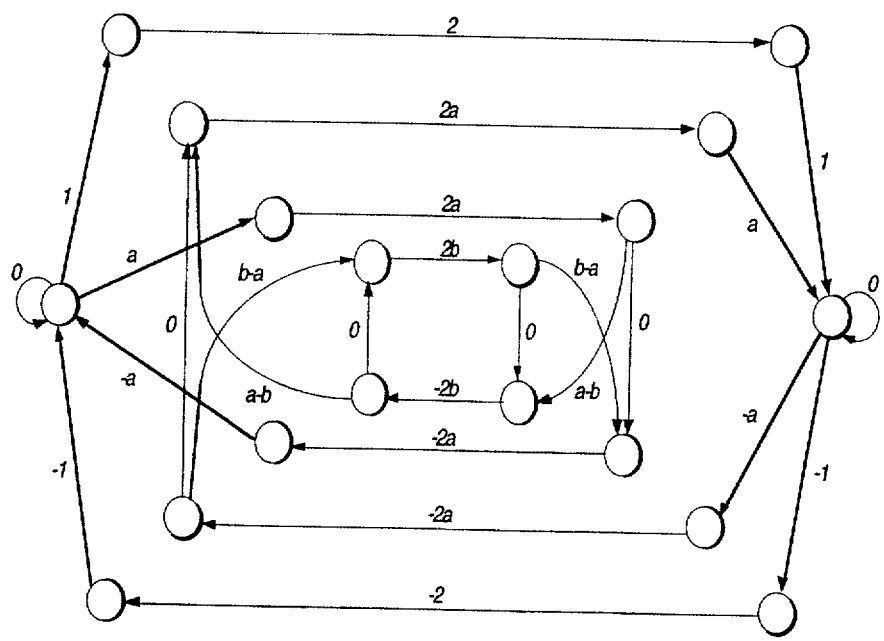

UNITED STATES PATENT AND TRADEMARK OFFICE
CERTIFICATE OF CORRECTION

PATENT NO : 5,862,161
DATED : Jan. 19, 1999
INVENTOR(S) : Reed et al.

It is certified that error appears in the above-identified patent and that said Letters Patent is hereby corrected as shown below:

In claim 12, the state machine should read:

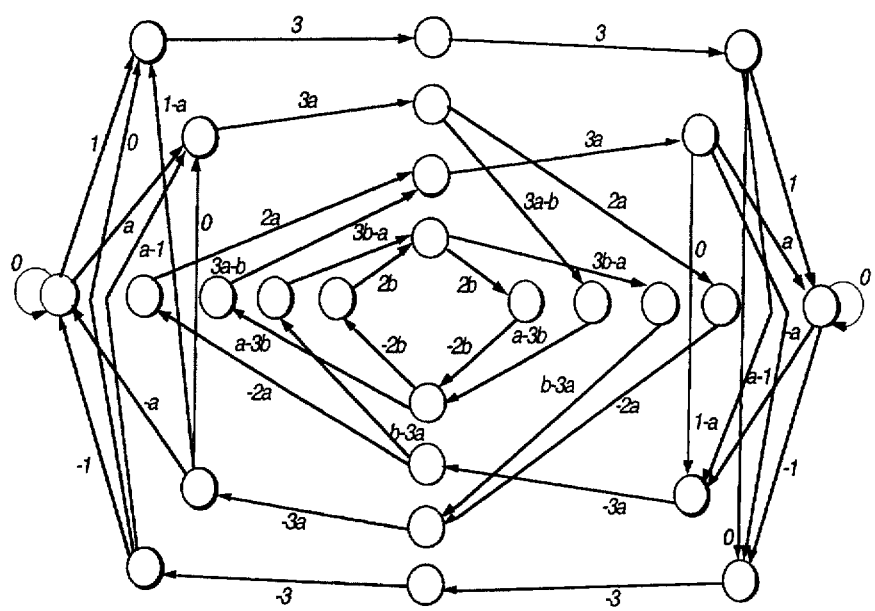

UNITED STATES PATENT AND TRADEMARK OFFICE
CERTIFICATE OF CORRECTION

PATENT NO : 5,862,161
DATED : Jan. 19, 1999
INVENTOR(S) : Reed et al.

It is certified that error appears in the above-identified patent and that said Letters Patent is hereby corrected as shown below:

In claim 14, the state machine should read:

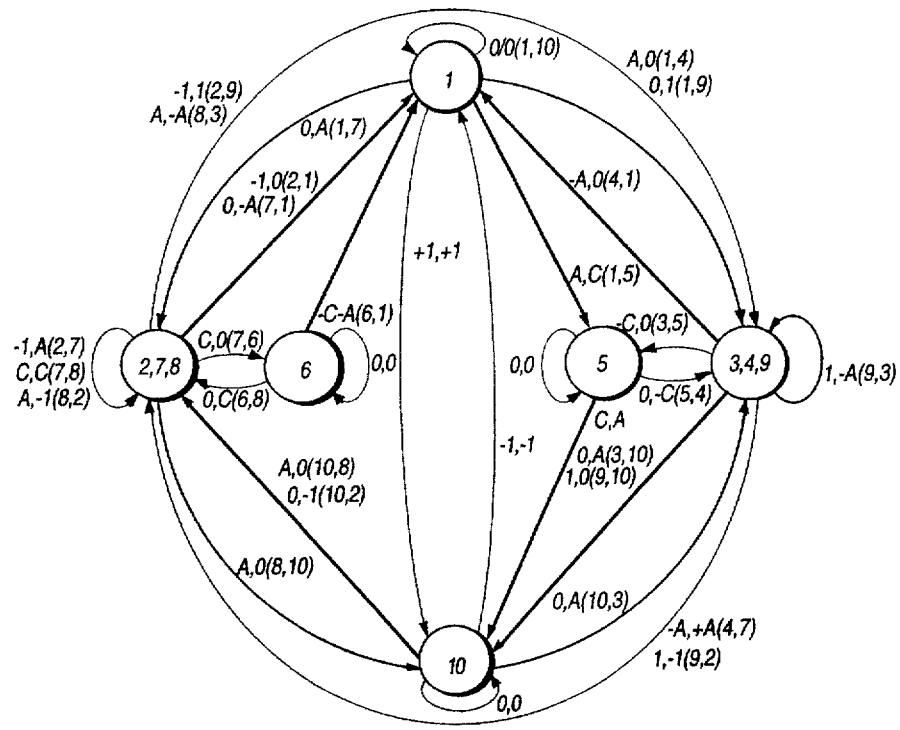

UNITED STATES PATENT AND TRADEMARK OFFICE
CERTIFICATE OF CORRECTION

PATENT NO : 5,862,161
DATED : Jan. 19, 1999
INVENTOR(S) : Reed et al.

It is certified that error appears in the above-identified patent and that said Letters Patent is hereby corrected as shown below:

In claim 15, the state machine should read:

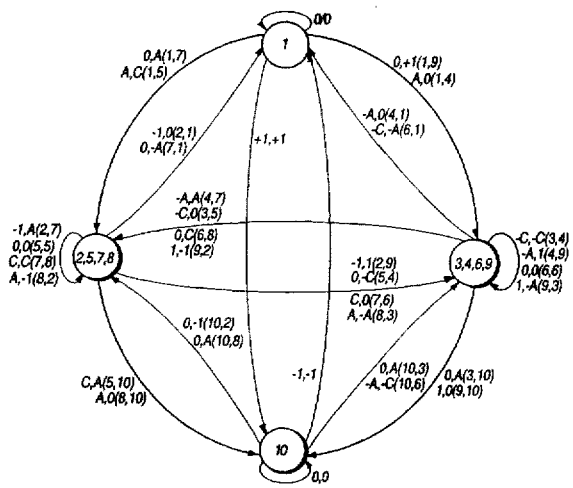

Signed and Sealed this

Eighteenth Day of May, 1999

Attest:

Q. TODD DICKINSON

*Attesting Officer*   Acting Commissioner of Patents and Trademarks